United States Patent
You et al.

(10) Patent No.: US 12,424,275 B2
(45) Date of Patent: Sep. 23, 2025

(54) STATIC RANDOM-ACCESS MEMORY (SRAM) DEVICE AND RELATED SRAM-BASED COMPUTE-IN-MEMORY DEVICES

(71) Applicant: Taiwan Semiconductor Manufacturing Company, Ltd., Hsinchu (TW)

(72) Inventors: Wei-Xiang You, Kaohsiung (TW); Szuya Liao, Hsinchu (TW); Cheng-Yin Wang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 245 days.

(21) Appl. No.: 18/359,395

(22) Filed: Jul. 26, 2023

(65) Prior Publication Data

US 2024/0282364 A1 Aug. 22, 2024

Related U.S. Application Data

(60) Provisional application No. 63/447,039, filed on Feb. 20, 2023.

(51) Int. Cl.
*G11C 11/412* (2006.01)
*G11C 11/419* (2006.01)
(Continued)

(52) U.S. Cl.
CPC .......... *G11C 11/412* (2013.01); *G11C 11/419* (2013.01); *H03K 19/20* (2013.01); *H10B 10/125* (2023.02)

(58) Field of Classification Search
CPC ... G11C 11/412; G11C 11/419; H10B 10/125; H03K 19/20
(Continued)

(56) References Cited

U.S. PATENT DOCUMENTS 7,663,237 B2 2/2010 Peng
8,467,263 B2 * 6/2013 Kulkarni ............... G11C 11/412
365/189.11
(Continued)

FOREIGN PATENT DOCUMENTS

DE 102017117936 A1 1/2019
JP H10208481 A 8/1998
(Continued)

OTHER PUBLICATIONS

Ahmad, Sayeed et al., "A Comprehensive Review of Design Challenges and Techniques for Nanoscale SRAM: A Cell Perspective", , (2022): TechRxiv. Preprint. https://doi.org/10.36227/techrxiv.21326055.v1, DOI: 10.36227/techrxiv.21326055.v1.
(Continued)

*Primary Examiner* — Ly D Pham
(74) *Attorney, Agent, or Firm* — Haynes and Boone, LLP

(57) ABSTRACT

An SRAM cell includes a first inverter cross-coupled to a second inverter. The first inverter includes a first pull-up transistor and a first pull-down transistor, having coupled drains that define a first storage node. The SRAM cell further includes a first N-type pass-gate transistor having a first drain coupled to a write bit line, a first source coupled to the first storage node, and a first gate coupled to a first write word line. The SRAM cell further includes a first P-type pass-gate transistor having a second drain coupled to the write bit line and a second source coupled to the first storage node. The SRAM cell further includes a P-type transistor having a third drain, coupled to a second gate of the first P-type pass-gate transistor, a third source coupled to a second write word line, and a third gate coupled to an enable signal.

20 Claims, 19 Drawing Sheets

(51) Int. Cl.
  *H03K 19/20* (2006.01)
  *H10B 10/00* (2023.01)
(58) Field of Classification Search
  USPC .......................................................... 365/154
  See application file for complete search history.

(56) References Cited

U.S. PATENT DOCUMENTS

| | | | |
|---|---|---|---|
| 8,605,523 B2 | 12/2013 | Tao | |
| 8,630,132 B2 | 1/2014 | Cheng | |
| 8,760,948 B2 | 6/2014 | Tao | |
| 9,773,545 B2* | 9/2017 | Liaw | G11C 11/419 |
| 2003/0076731 A1* | 4/2003 | Terada | G11C 8/16 |
| | | | 365/230.05 |
| 2005/0036394 A1* | 2/2005 | Shiraishi | G11C 11/419 |
| | | | 365/232 |
| 2006/0126420 A1* | 6/2006 | Kurumada | G11C 8/16 |
| | | | 365/230.05 |
| 2009/0147560 A1 | 6/2009 | Joshi et al. | |
| 2011/0255361 A1* | 10/2011 | Russell | G11C 7/1075 |
| | | | 365/189.011 |
| 2013/0154027 A1* | 6/2013 | Liaw | H10D 89/10 |
| | | | 257/E27.06 |
| 2014/0032871 A1 | 1/2014 | Hsu | |
| 2014/0153321 A1 | 6/2014 | Liaw | |
| 2014/0153345 A1 | 6/2014 | Kim | |
| 2014/0177352 A1 | 6/2014 | Lum | |
| 2014/0233330 A1 | 8/2014 | Ko | |
| 2014/0241077 A1 | 8/2014 | Katoch | |
| 2014/0269114 A1 | 9/2014 | Yang | |
| 2021/0158855 A1* | 5/2021 | Banerjee | G11C 11/419 |
| 2022/0209774 A1 | 6/2022 | Liaw | |

FOREIGN PATENT DOCUMENTS

| | | |
|---|---|---|
| KR | 20180137388 A | 12/2018 |
| TW | I762158 B | 4/2022 |
| TW | I787830 B | 12/2022 |

OTHER PUBLICATIONS

Baig, Aftab et al., "3D Monolithic Stacking of Complementary-FET on CMOS for Next Generation Compute-In-Memory SRAM", IEEE Journal of the Electron Devices Society, DOI 10.1109/JEDS.2022.3230542.

Kiran, Vamsi et al., "Design and Analysis of Different Types SRAM Cell Topologies," 2nd International Conference on Electronics and Communication System (ICECS 2015), DOI: 10.1109/ECS.2015.7124742.

Lin, Zhiting et al., "A review on SRAM-based computing in-memory: Circuits, functions, and applications", Journal of Semiconductors, (2022) 43, 031401, DOI: 10.1088/1674-4926/43/3/031401.

Majumdar, Budhaditya et al, "Low power single bitline 6T SRAM cell with High Read Stability," 2011 International Conference on Recent Trends in Information Systems, Dec. 2011, DOI: 10.1109/ReTIS.2011.6146862.

Mittal, Sparsh et al, "A Survey of SRAM-based In-Memory Computing Techniques and Applications", Journal of Systems Architecture, Aug. 2021, DOI: 10.1016/j.sysarc.2021.102276.

Sharma, Rajni et al, "Stability Analysis of 6T SRAM at 32 Nm Technology", International Journal of Innovative Research in Science, Engineering and Technology, vol. 3, Issue 5, May 2014.

* cited by examiner

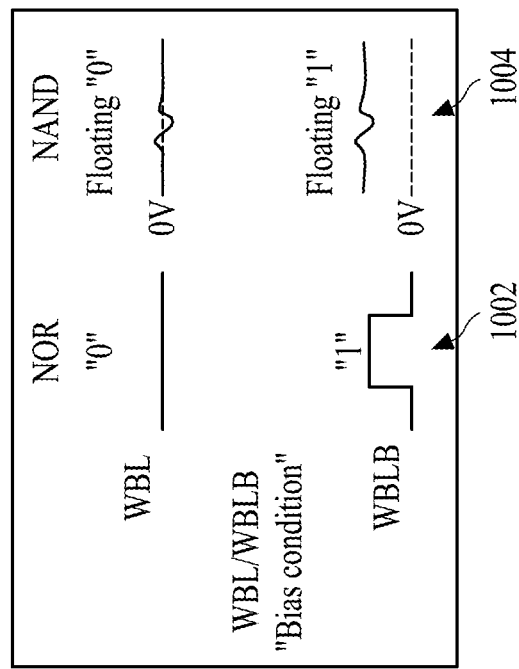
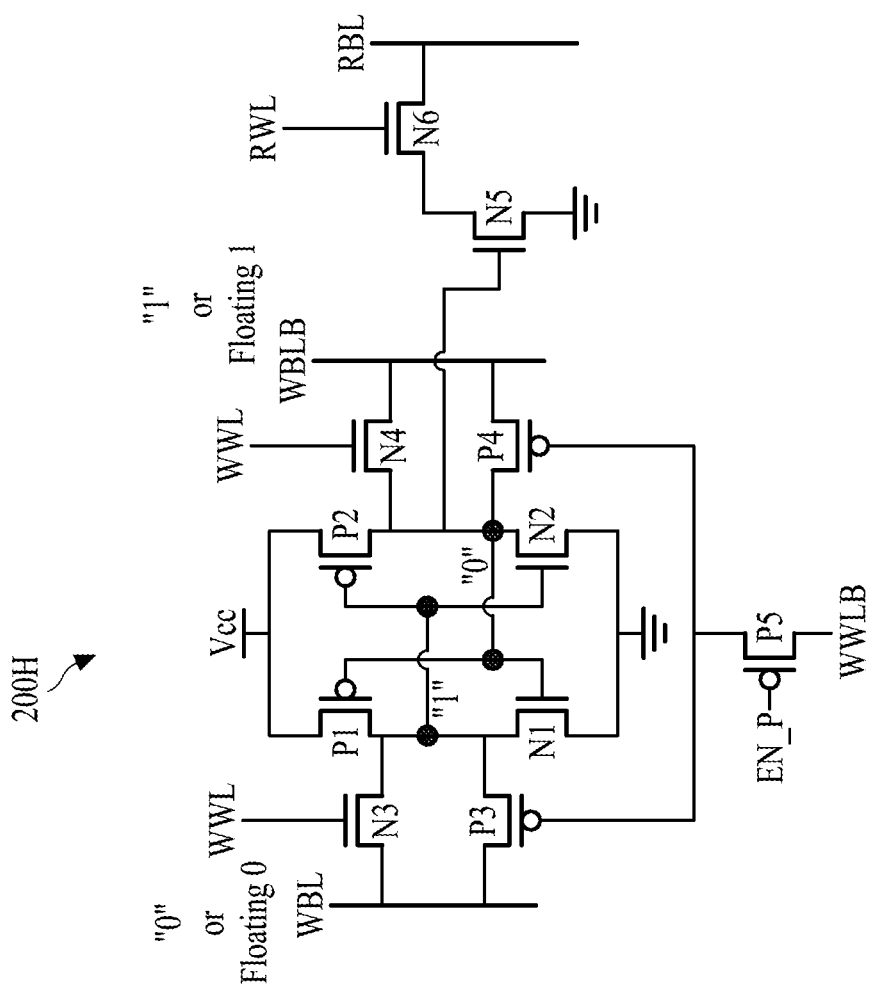
FIG. 10A
FIG. 10B

| Logic gate | NOR | NAND | OR | AND | IMP | NIMP |
|---|---|---|---|---|---|---|
| Reconfigurable Schemes | Pulse width / Pulse amplitude / WBL & WBLB bias condition | | | | | |
| Reconfigurable Settings | Long/High/Biased | Short/Low/Floating | Long/High/Biased | Short/Low/Floating | Short/Low/Floating | Short/Low/Floating |
| Input/Output | A B Y<br>WWL WWLB Output | A B Y<br>WWL WWLB Output | A B Y<br>WWL WWLB Output1 | A B Y<br>WWL WWLB Output1 | A B Y<br>WWL WWLB Output1 | A B Y<br>WWL WWLB Output1 |

Logic Truth Table

| A | B | NOR | NAND | OR | AND | IMP | NIMP |
|---|---|---|---|---|---|---|---|
| 0 | 0 | 1 | 1 | 0 | 0 | 1 | 0 |
| 0 | 1 | 0 | 1 | 1 | 0 | 1 | 0 |
| 1 | 0 | 0 | 1 | 1 | 0 | 0 | 1 |
| 1 | 1 | 0 | 0 | 1 | 1 | 1 | 0 |

| Bitcell Type | Effective Width ($W_{eff}$) | Bitcell Area Ratio | |
|---|---|---|---|
| | | Non-stacked CMOS | Vertically stacked struture (e.g., CFET) |
| 6T HC SRAM | PU:PG:PD =1:2:2 | 1X | ~0.68X |
| 8T SRAM | PU:PG:PD:RP =1:2:2:2 | ~1.28X | ~1.03X |
| 11T SRAM | PU:PG:PD:RP =1:1:1:2 | ~1.32X | ~1.06X |

FIG. 12

STATIC RANDOM-ACCESS MEMORY (SRAM) DEVICE AND RELATED SRAM-BASED COMPUTE-IN-MEMORY DEVICES

CROSS-REFERENCE TO RELATED APPLICATION

This application claims the benefit of U.S. Provisional Application No. 63/447,039, filed Feb. 20, 2023, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As one example, static random-access memory (SRAM) devices have become a popular choice for use in a variety of applications, in part for their faster speeds, low power consumption, and data retention, among others. However, a number of challenges related to SRAM devices remain. For instance, write ability is a key factor used to determine an SRAM minimum operating voltage (VMIN) for low power operation. To increase the write ability, a high-current (HC) SRAM cell may be designed in part by appropriately sizing an effective channel width (Weff) of constituent SRAM transistors (e.g., N-type/P-type transistors), and a write assist technique may be introduced for high density (HD) SRAM cells having a minimum and identical effective channel width for constituent SRAM transistors. However, optimizing the effective channel width of N-type/P-type transistors separately may result in an extra cost and increased process complexity. In addition, the use of a write assist technique may result in an SRAM macro area penalty, additional power consumption, and degraded data stability. Further, when applied to compute-in-memory (CIM) applications, the SRAM cells (or SRAM cell array) and peripheral circuits used to implement SRAM-based CIM devices may utilize a large area to perform logic gate operations, resulting in a low computational density (e.g., number of logic gates per unit area).

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A, 10B, 10C, and 10D illustrate an SRAM cell, exemplary bias conditions, truth tables, and timing diagrams for a third reconfigurable scheme of the SRAM-based CIM device of FIG. 6, in accordance with some embodiments;

FIG. 11A provides a table showing exemplary CIM settings for implementing different logic gates using the disclosed SRAM cell, and FIG. 11B provides a truth table for the different logic gates included in the table of FIG. 11A, in accordance with some embodiments;

FIG. 12 provides a table showing a comparison of transistor effective widths (Weff) and bitcell areas for different SRAM cell topologies, in accordance with some embodiments.

DETAILED DESCRIPTION

Figure 1:
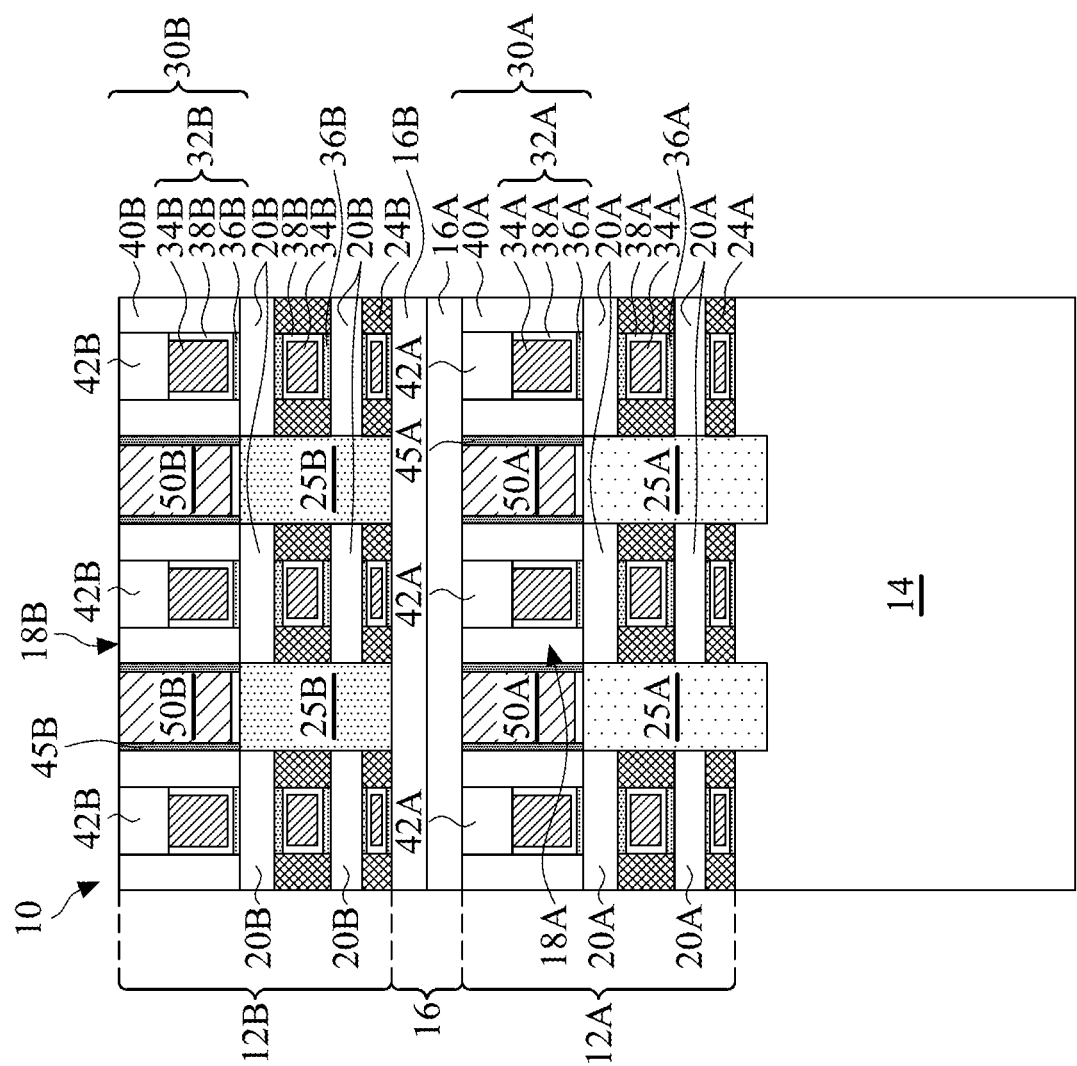
FIG. 1 is a fragmentary cross-sectional view of a stacked device structure, in portion or entirety, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates generally to static random-access memory (SRAM) devices and SRAM-based compute-in-memory (CIM) devices. Transistors used to form such devices may include N-type transistors (NFETs), P-type transistors (PFETs), or a combination thereof. In some embodiments, the devices disclosed herein may include transistor devices having stacked transistor structures, such as a complementary field-effect transistor (CFET), with a P-type transistor (PFET) stacked on top of an N-type transistor (NFET), or vice-versa. In various cases, the transistors themselves may include a number of different types of transistors such as planar field-effect transistors (FETs), multi-gate transistors such as FinFETs, gate-all-around (GAA) transistors, omega-gate (Ω-gate) devices, pi-gate (Π-gate) devices, or a combination thereof, as well as strained-semiconductor devices, silicon-on-insulator (SOI) devices, partially-depleted SOI devices, fully-depleted SOI devices, other devices, or a combination thereof.

SRAM devices have become a popular choice for use in a variety of applications, in part for their faster speeds, low power consumption, and data retention, among others. However, a number of challenges related to SRAM devices remain. For instance, write ability is a key factor used to determine an SRAM minimum operating voltage (VMIN) for low power operation. To increase the write ability, a high-current (HC) SRAM cell may be designed in part by appropriately sizing an effective channel width (Weff) of constituent SRAM transistors (e.g., NFETs/PFETs), and a write assist technique may be introduced for high density (HD) SRAM cells having a minimum and identical effective channel width for constituent SRAM transistors. However, optimizing the effective channel width of NFET and PFET transistors separately may result in an extra cost and increased process complexity, in particular for vertically stacked transistor structures such as CFETs. In addition, the use of a write assist technique may result in an SRAM macro area penalty, additional power consumption, and degraded data stability. Further, when applied to CIM applications, the SRAM cells (or SRAM cell array) and peripheral circuits used to implement SRAM-based CIM devices may utilize a large area to perform logic gate operations, resulting in a low computational density (e.g., number of logic gates per unit area). Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for providing a write-enhanced SRAM device and SRAM-based CIM devices. In some embodiments, a stacked transistor structure, such as a CFET structure, is used to implement an SRAM device. For purposes of this disclosure, such a device may be referred to as a CFET-SRAM device. In some examples, one or more (previously) dummy PFETs of a vertically stacked device structure (CFET) may be used to enhance a write ability of an SRAM, and in particular, to provide a write-enhanced single-ended 11-transistor (11T) SRAM. The write-enhanced single-ended 11T SRAM may be configured to operate in accordance with three reconfigurable schemes to perform logic gate functionalities. Moreover, in various embodiments, the enhanced write ability may be provided without the introduction of write assist techniques and additional NFET/PFET Weff sizing processes to decouple the Weff for vertically stacked devices (CFETs). Further, in accordance with the disclosed embodiments, the write ability of the proposed SRAM can be enhanced by more than 2.5× compared with a 6-transistor (6T) or 8-transistor (8T) SRAM while mitigating the write half-selected disturb issue. The three reconfigurable schemes for the proposed SRAM may be configured to perform at least six types of logic gate functionalities, in some embodiments. Moreover, by employing CFET technology and in some examples, the proposed SRAM device occupies a very small area (small area overhead) as compared with a 6T HC SRAM cell using a non-stacked CMOS process and has a comparable footprint to a standard 8T SRAM cell. Additional embodiments and advantages are discussed below and/or will be evident to those skilled in the art in possession of this disclosure.

Because one or more of the embodiments described herein are exemplified by SRAM devices implemented using CFETs, a description of an exemplary CFET is provided below with respect to FIG. 1. However, it should be understood that other types of devices may benefit from one or more of the embodiments described herein.

FIG. 1 provides a fragmentary cross-sectional view of a stacked device structure 10, in portion or entirety, according to various aspects of the present disclosure. Stacked device structure 10 includes a device 12A, a device 12B, a substrate 14, and an insulation layer 16. Device 12B is vertically stacked over device 12A, insulation layer 16 is disposed between and separates device 12B and device 12A, and device 12A is disposed over substrate 14. In the depicted embodiment, device 12A and device 12B are stacked back-to-front. For example, a backside of device 12B is attached and/or bonded to a frontside of device 12A by insulation layer 16, which includes an insulation layer 16A and an insulation layer 16B. In some embodiments, insulation layer 16A is formed on the frontside of device 12A, insulation layer 16B is formed on the backside of device 12B, and insulation layer 16B is attached to insulation layer 16A (e.g., using a dielectric-to-dielectric bonding process). It will be understood that FIG. 1 has been simplified for the sake of clarity, and in some embodiments, additional features can be added to the stacked device structure 10, some features can be replaced, modified, or eliminated, without departing from the scope of the present disclosure.

In FIG. 1, device 12A and device 12B include at least one electrically functional device, such as a transistor 18A and a transistor 18B, respectively. Stacked device structure 10 thus includes a transistor stack having a top transistor (e.g., transistor 18B) and a bottom transistor (e.g., transistor 18A)

separated and isolated by insulation layer 16. In some embodiments, transistor 18A and transistor 18B are transistors of an opposite conductivity type. For example, transistor 18A may be a P-type transistor, and transistor 18B may be an N-type transistor, or vice versa. In such embodiments, transistor 18A and transistor 18B form a CFET device. In some embodiments, transistor 18A and transistor 18B includes transistors of a same conductivity type. For example, transistor 18A and transistor 18B may both be N-type transistors or P-type transistors.

Device 12A includes various features and/or components, such as semiconductor layers 20A, inner spacers 24A, epitaxial source/drains 25A, and gate structures 30A. Each gate structure 30A can include a gate stack having a gate dielectric 32A and a gate electrode 34A. Gate dielectric 32A can include an interfacial layer 36A and a gate dielectric layer 38A (e.g., a high-k dielectric layer). The gate stack can further include a hard mask layer 42A. Each gate structure 30A can further include gate spacers 40A disposed along sidewalls of the gate stack. Device 12A further includes dielectric layers, such as an interlayer dielectric (ILD) layer and a contact etch stop layer (CESL) 45A, and source/drain contacts 50A.

In the depicted embodiment, transistor 18A is a gate-all-around (GAA) transistor. For example, transistor 18A has two channels provided by respective semiconductor layers 20A (referred to as channel layers 20A hereafter), which are suspended over substrate 14 and extend between respective source/drains (e.g., epitaxial source/drains 25A). Transistor 18A further has a respective gate structure 30A disposed over its channel layers 20A and between its epitaxial source/drains 25A, where inner spacers 24A are disposed between the gate stack of its gate structure 30A and its epitaxial source/drains 25A. Along a gate widthwise direction (e.g., in an X-Z plane), such as depicted, the gate stack of gate structure 30A is over top channel layer 20A, between channel layers 20A, and between bottom channel layer 20A and a mesa of substrate 14. Along a gate lengthwise direction (e.g., in a Y-Z plane), the gate stack of gate structure 30A wraps around channel layers 20A. During operation of the GAA transistor, current can flow through channel layers 20A and between epitaxial source/drains 25A.

Device 12B includes various features and/or components, such as semiconductor layers 20B, inner spacers 24B, epitaxial source/drains 25B, and gate structures 30B. Each gate structure 30B can include a gate stack having a gate dielectric 32B and a gate electrode 34B. Gate dielectric 32B can include an interfacial layer 36B and a gate dielectric layer 38B (e.g., a high-k dielectric layer). The gate stack can further include a hard mask layer 42B. Each gate structure 30B can further include gate spacers 40B disposed along sidewalls of the gate stack. Device 12B further includes dielectric layers, such as an ILD layer and/or a CESL 45B, and source/drain contacts 50B disposed on epitaxial source/drains 25B.

In the depicted embodiment, transistor 18B is also a GAA transistor. For example, transistor 18B has two channels provided by respective semiconductor layers 20B (referred to as channel layers 20B hereafter), which are suspended over substrate 14 and extend between respective source/drains (e.g., epitaxial source/drains 25B). Transistor 18B further has a respective gate structure 30B disposed over its channel layers 20B and between its epitaxial source/drains 25B, where inner spacers 24B are disposed between the gate stack of its gate structure 30B and its epitaxial source/drains 25B. Along a gate widthwise direction (e.g., in an X-Z plane), such as depicted, the gate stack of gate structure 30B is over top channel layer 20B, between channel layers 20B, and between bottom channel layer 20B and insulation layer 16. Along a gate lengthwise direction (e.g., in a Y-Z plane), the gate stack of gate structure 30B wraps around channel layers 20B. During operation of the GAA transistor, current can flow through channel layers 20B and between epitaxial source/drains 25B.

Transistors of a stacked transistor structure, such as stacked device structure 10, can be fabricated separately, monolithically, or sequentially. When fabricated separately, a top transistor and a bottom transistor may be separately fabricated, and then, the top transistor is bonded/attached to the bottom transistor. When fabricated monolithically, a top transistor and a bottom transistor are fabricated from an initial device structure. In some examples of monolithic fabrication, a first set of semiconductor layers may be bonded/attached to a second set of semiconductor layers and then processed to form the top transistor and the bottom transistor, respectively. In other examples of monolithic fabrication, a first set of semiconductor layers may be epitaxially grown, followed by growth of a dielectric layer, and further followed by epitaxial growth of a second set of semiconductor layers, to provide a stack of layers which are then processed to form the top transistor and the bottom transistor, respectively. When fabricated sequentially, a first set of semiconductor layers may be processed to form a bottom transistor, and then, a second set of semiconductor layers is attached/bonded to the bottom transistor and processed to form a top transistor (i.e., the top transistor is fabricated on the bottom transistor). As described in more detail below, and in various embodiments, by employing a CFET device structure (e.g., such as stacked device structure 10), the disclosed SRAM device will occupy a very small area (small area overhead) as compared with at least some existing implementations.

Figure 2:
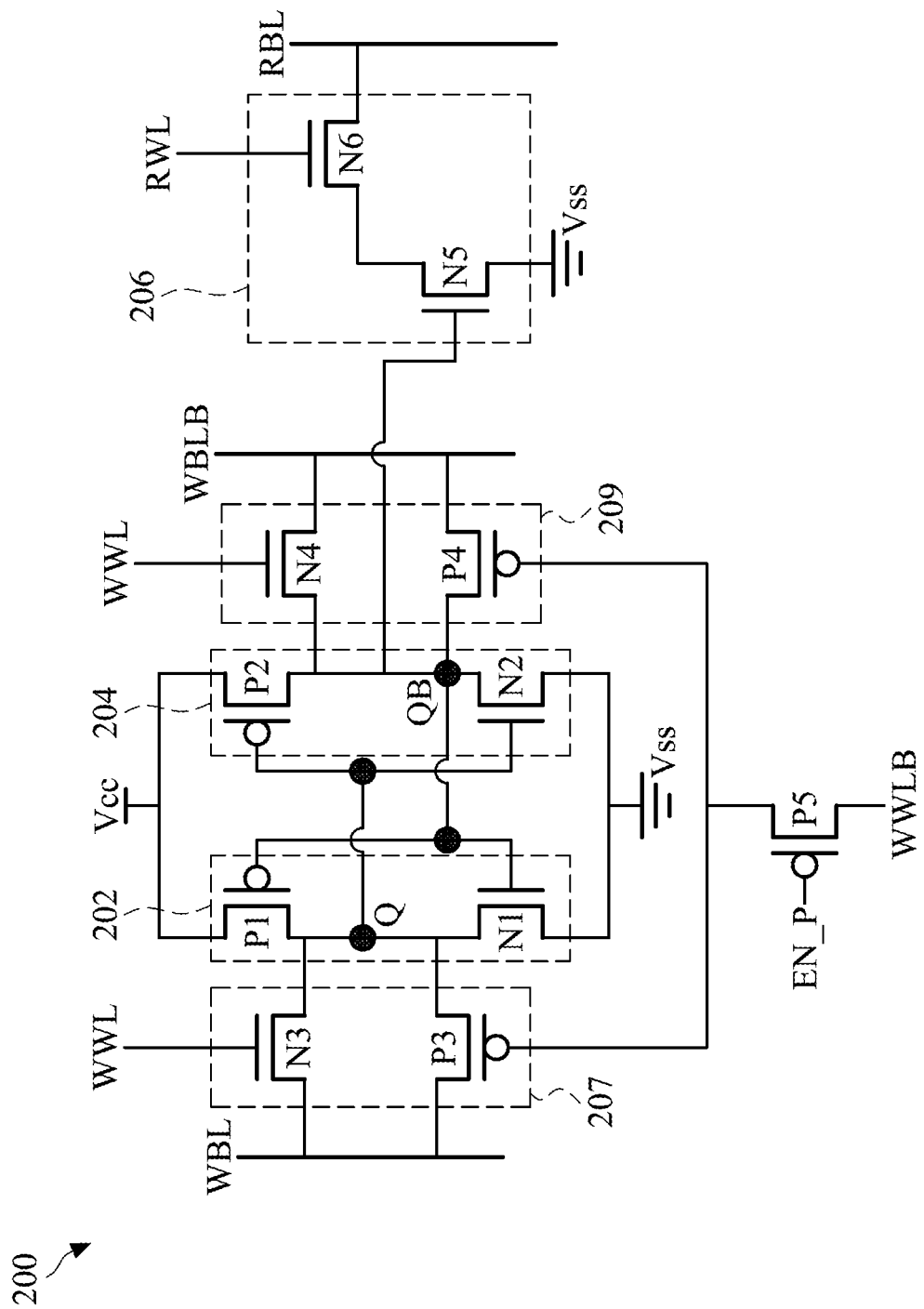
FIG. 2, provides an exemplary circuit diagram of an SRAM cell, which can be implemented in a memory cell of an SRAM array, according to various aspects of the present disclosure.

With reference now to FIG. 2, illustrated therein is an exemplary circuit diagram of an SRAM cell 200, which can be implemented in a memory cell of an SRAM array, according to various aspects of the present disclosure. The transistors used for the SRAM cell 200, which may be N-type or P-type transistors, may include GAA transistors, FinFETs, planar FETs, or other transistor type, as described above. In addition, at least some of the N-type and P-type transistors of the SRAM cell 200 may be part of a CFET device structure (e.g., such as stacked device structure 10 of FIG. 1). FIG. 2 has been simplified for the sake of clarity to better understand the inventive concepts of the present disclosure. Additional features can be added in the SRAM cell 200, and some of the features described below can be replaced, modified, or eliminated in other embodiments of SRAM cell 200.

The SRAM cell 200 includes eleven transistors, and may thus be referred to as an 11T SRAM cell. The SRAM cell 200 includes a bitcell consisting of a symmetric CMOS latch that provides a storage portion of the SRAM cell 200. In an example, the symmetric CMOS latch includes a cross-coupled pair of inverters, consisting of an inverter 202 and an inverter 204. Inverter 202 includes a pull-up transistor P1 and a pull-down transistor N1, and inverter 204 includes a pull-up transistor P2 and a pull-down transistor N2. The pull-up transistors P1, P2 are P-type transistors and the pull-down transistors N1, N2 are N-type transistors. In at least some implementations, the pull-up transistors P1, P2 are configured as P-type GAA transistors, and the pull-down transistors N1, N2 are configured as N-type GAA transistors. In some implementations, the SRAM cell 200 further includes a pass-gate transistor N3, a pass-gate transistor P3, a pass-gate transistor N4, and a pass-gate transistor P4. The pass-gate transistors N3, N4 are N-type transistors, and the pass-gate transistors P3, P4 are P-type transistors. In at least some implementations, the pass-gate transistors N3, N4 are configured as N-type GAA transistors, and the pass-gate transistors P3, P4 are configured as P-type GAA transistors. In operation, pass-gate transistors N3, P3, N4, P4 provide access to the storage portion of the SRAM cell 200. Additionally, in various embodiments, use of the four pass-gate transistors N3, P3, N4, P4 enhances the write ability of the SRAM cell 200, as discussed further below. In some embodiments, the SRAM cell 200 also includes another P-type transistor P5 to control the pass-gate transistors P3, P4. In at least some implementations, the transistor P5 is configured as a P-type GAA transistor. The SRAM cell 200, in some examples, further includes a single-ended read-port 206, consisting of N-type transistors N5 and N6, and which is isolated from storage nodes Q and QB of the storage portion of the SRAM cell 200. In at least some implementations, the transistors N5, N6 are configured as N-type GAA transistors.

As shown in FIG. 2, drains of the pull-up transistor P1 and the pull-down transistor N1 are electrically coupled and define a first node (e.g., the storage node Q), and drains of the pull-up transistor P2 and the pull-down transistor N2 are electrically coupled and define a second node (e.g., the storage node QB). By way of example, the storage node Q stores data in true form, and the storage node QB stores data in complementary form. Gates of the pull-up transistor P1 and the pull-down transistor N1 are electrically coupled to each other and to the second node, and gates of the pull-up transistor P2 and the pull-down transistor N2 are electrically coupled to each other and to the first node. The sources of the pull-up transistors P1, P2 are electrically connected to a power supply ($V_{CC}$), and the sources of the pull-down transistors N1, N2 are electrically connected to a complementary power supply ($V_{SS}$).

The drains of the pass-gate transistors N3, P3 are electrically connected to a write bit-line (WBL). The sources of the pass-gate transistors N3, P3 are electrically connected to the first node. The gate of the pass-gate transistor N3 is electrically connected to a write word-line (WWL). The gate of the pass-gate transistor P3 is electrically connected to the gate of the pass-gate transistor P4 and to the drain of the transistor P5. The drains of the pass-gate transistors N4, P4 are electrically connected to a write bit-line bar (WBLB). The sources of the pass-gate transistors N4, P4 are electrically connected to the second node. The gate of the pass-gate transistor N4 is electrically connected to the write word-line (WWL). The gate of the pass-gate transistor P4 is electrically connected to the gate of the pass-gate transistor P3 and to the drain of the transistor P5, as previously noted. The source of the transistor P5 is electrically connected to a write word-line bar (WWLB), and the gate of the transistor P5 is electrically connected to an enable line (EN_P) that controls the transistor P5.

Regarding the single-ended read-port 206, the gate of the transistor N5 is electrically connected to the storage node QB, the source of the transistor N5 is electrically connected to the complementary power supply ($V_{SS}$), and the drain of the transistor N5 is electrically connected to the source of the transistor N6. The drain of the transistor N6 is electrically connected to a read bit-line (RBL) and the gate of the transistor N6 is electrically connected to a read word line (RWL). In some examples, the pass-gate transistors N3, P3, N4, P4 provide access to storage nodes Q, QB during write operations. For example, pass-gate transistors N3, P3 and pass-gate transistors N4, P4 couple storage nodes Q, QB, respectively, to the write bit-line (WBL) and the write bit-line bar (WBLB) in response to voltage applied to the gates of pass-gate transistors N3, P3, N4, P4. In some examples, the transistors N5, N6 of the single-ended read-port 206 provide access to the storage portion of the SRAM cell 200 during read operations, as described in more detail below.

As disclosed herein, and in various embodiments, the single-ended read-port 206 is configured to mitigate a read disturb. Further, the SRAM cell 200 can provide a significant write margin enhancement (e.g., about 2.5× as compared to a 6T or an 8T SRAM cell) without sacrificing the write half-selected disturb issue. In accordance with the disclosed embodiments, there is also no need to use write assist techniques and additional NFET/PFET Weff sizing processes to decouple the Weff for vertically stacked devices to achieve a desired write margin. In some examples, the adjustable write ability of the SRAM cell 200, as discussed further below, also enables reconfigurable schemes for the SRAM cell 200 to perform at least six types of logic gate functionalities and thereby implement Boolean CIM functionality using a single bitcell.

Figure 3:
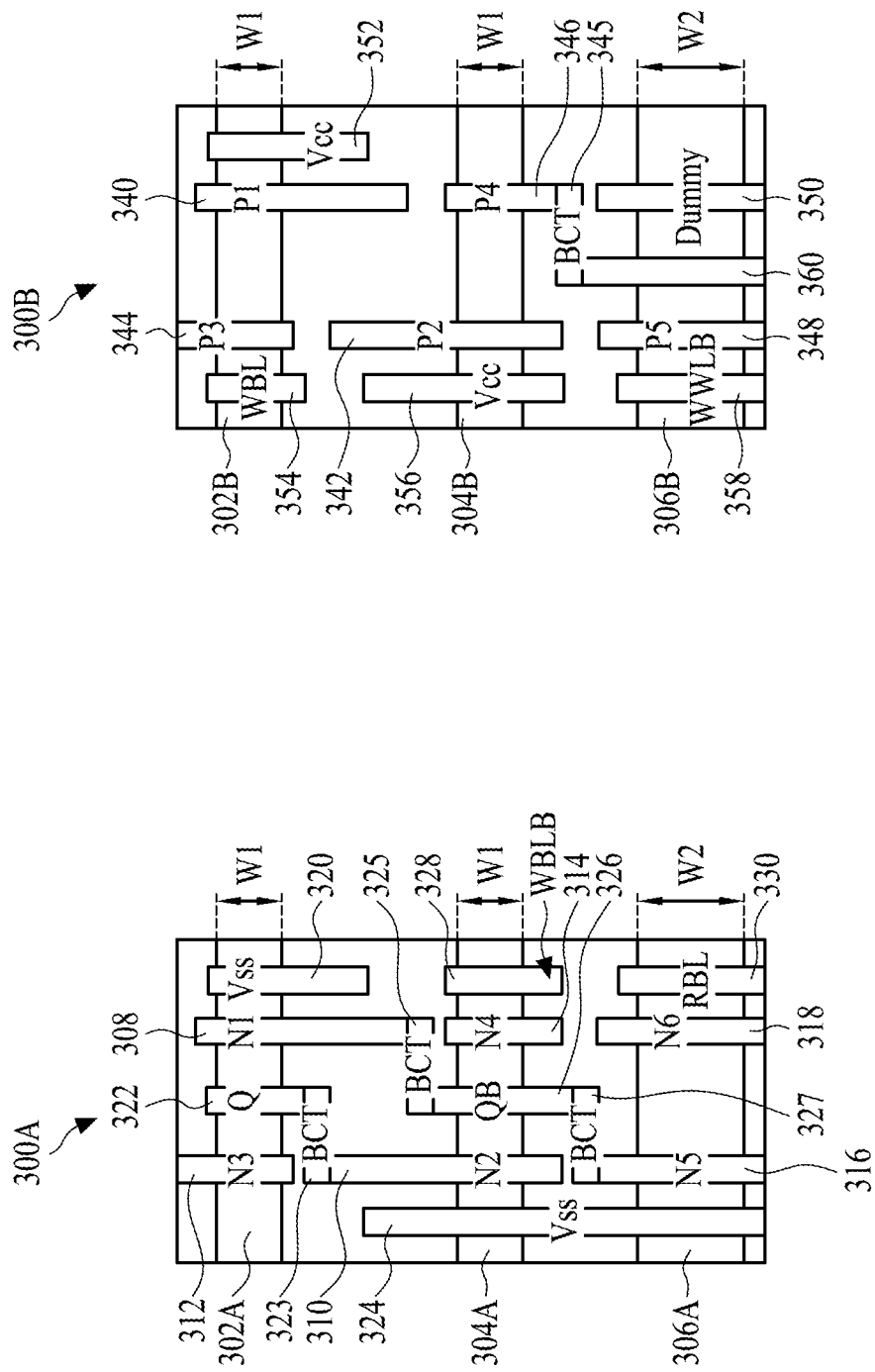
FIGS. 3A and 3B illustrate exemplary layout views of an SRAM cell, such as the SRAM cell of FIG. 2, configured for fabrication using a stacked device structure technology, in accordance with some embodiments.

In addition, in some embodiment, the SRAM cell 200 may be fabricated using a CFET device structure (e.g., such as stacked device structure 10), so that the bitcell area overhead of the SRAM cell 200 can be minimized. To further illustrate this point, reference is made to FIGS. 3A and 3B, which illustrate exemplary layout views 300A, 300B of an SRAM cell, such as the SRAM cell 200, configured for fabrication using a stacked device structure technology (e.g., CFET technology). For clarity of discussion, it will be understood that the layout views 300A, 300B have been simplified for a better understanding of the inventive features of the present disclosure. In the illustrated embodiments, the layout view 300A includes a top device layer layout that corresponds to a layer of the stacked device structure 10 (FIG. 1) that includes the device 12B (which may include a plurality of functional devices, such as N-type transistors, in one example), and the layout view 300B includes a bottom device layer layout that corresponds to a layer of the stacked device structure 10 that includes the device 12A (which may include a plurality of functional devices, such as P-type transistors, in one example). Stated another way, the elements shown in the layout view 300A may be fabricated in a top layer of a stacked device structure (e.g., where the top layer is an N-type device layer, in an example), and the elements shown in the layout view 300B may be fabricated in a bottom layer of the stacked device structure (e.g., where the bottom layer is a P-type device layer, in an example. The layout views 300A, 300B also correspond to the SRAM cell 200, thus various labeled features of the exemplary circuit diagram of FIG. 2 are similarly labeled in the layout views 300A, 300B of FIGS. 3A and 3B. As shown, each of the N-type transistors N1, N2, N3, N4, N5, N6 of the SRAM cell 200 are formed within the top layer of the stacked device structure (e.g., as shown in layout view 300A), and each of the P-type transistors P1, P2, P3, P4, P5 of the SRAM cell are formed within the bottom layer of the stacked device structure (e.g., as shown in layout view 300B).

As shown, the top layer of the stacked device structure (e.g., as shown in layout view 300A) may include active regions 302A, 304A, 306A, and the bottom layer of the stacked device structure (e.g., as shown in layout view 300B) may include active regions 302B, 304B, 306B. In some cases, the active regions 302A, 304A, 306A, 302B, 304B, 306B may include a plurality of nanosheets or semiconductor channel layers (e.g., such as semiconductor layers 20A, 20B of FIG. 1), used to form a GAA transistors. Thus, in some cases, the width of the active regions 302A, 304A, 306A, 302B, 304B, 306B may be substantially equal to a width (or effective width) of the nanosheets (semiconductor channel layers) used to form the GAA transistors. In some examples, the active regions 302A, 304A, 306A, 302B, 304B, 306B may also include source/drain regions including epitaxial source/drain structures that are formed, for example, on opposing sides of respective gate structures and coupled to respective ones of the plurality of semiconductor channel layers. In various embodiments, the active regions 302A, 304A, 306A may be disposed at a same elevation as each other, for example, within a same device layer. Likewise, the active regions 302B, 304B, 306B may be disposed at a same elevation as each other, for example, within a same device layer. In some embodiments, the active regions 302A, 302B, 304A, 304B have a width 'W1' of about 10-60 nm. In some embodiments, the active regions 306A, 306B have a width 'W2' that is equal to about twice the width of 'W1'.

With reference to the N-type transistors of the SRAM cell 200 (e.g., as shown in layout view 300A), a gate structure 308 is disposed over the active region 302A, to provide the gate of the transistor N1, a gate structure 310 is disposed over the active region 304A, to provide the gate of the transistor N2, a gate structure 312 is disposed over the active region 302A, to provide the gate of the transistor N3 (write word-line, WWL), a gate structure 314 is disposed over the active region 304A, to provide the gate of the transistor N4 (write word-line, WWL), a gate structure 316 is disposed over the active region 306A, to provide the gate of the transistor N5, and a gate structure 318 is disposed over the active region 306A, to provide the gate of the transistor N6 (read word line, RWL). Generally, a transistor may be formed at intersections of a gate structure and an active region, as described herein.

Still referring to the N-type transistors of the SRAM cell 200 (e.g., as shown in layout view 300A), metal lines 320, 322, 324, 326, 328, 330 may be formed within a same interconnect layer (e.g., such as an M0 interconnect layer). In some embodiments, the metal lines may be electrically connected by a conductive via to respective underlying active regions, as described below. Additionally, butted contacts (BCTs) 323, 325, 327 may be formed to electrically connect gates and sources/drains of some transistors, as described herein. In some embodiments, the metal line 320 may be electrically connected to underlying active region 302A (including a source of the transistor N1) and to the complementary power supply ($V_{SS}$). The metal line 322 may be electrically connected to underlying active region 302A (including a drain of the transistor N1 and a source of the transistor N3), which provides the storage node Q, and to the gate structure 310 (gate of transistor N2) by way of BCT 323. The gate structure 308 (gate of transistor N1) is also electrically connected, by way of BCT 325, to metal line 326, which contacts an underlying active region 304A (including a drain of transistor N2 and the source of the transistor N4) and provides the storage node QB. The metal line 326 is further electrically connected, by way of BCT 327, to gate structure 316 (gate of transistor N5). The metal line 324 is electrically connected to underlying active regions 304A, 306A (including sources of the transistors N2, N5) and to the complementary power supply ($V_{SS}$). The metal line 328 is electrically connected to the underlying active region 304A (including the drain of the transistor N4) and provides the write bit-line bar (WBLB). The metal line 330 is electrically connected to the underlying active region 306A (including the drain of the transistor N6) and provides the read bit-line (RBL).

With reference to the P-type transistors of the SRAM cell 200 (e.g., as shown in layout view 300B), a gate structure 340 is disposed over the active region 302B, to provide the gate of the transistor P1, a gate structure 342 is disposed over the active region 304B, to provide the gate of the transistor P2, a gate structure 344 is disposed over the active region 302B, to provide the gate of the transistor P3, a gate structure 346 is disposed over the active region 304B, to provide the gate of the transistor P4, a gate structure 348 is disposed over the active region 306B, to provide the gate of the transistor P5 (enable line, EN_P), and a gate structure 350 is disposed over the active region 306B, to provide a dummy gate. It is noted that in contrast to at least some implementations, such as an 8T SRAM implemented using a stacked device structure (CFET) and which may include four dummy P-type transistors, the presently disclosed 11T SRAM effectively uses several of the (previously) dummy P-type transistors to provide transistors P3, P4, P5 and thereby enhance the write ability of the SRAM device, as described herein.

Still referring to the P-type transistors of the SRAM cell 200 (e.g., as shown in layout view 300B), metal lines 352, 354, 356, 358, 360 may be formed within a same interconnect layer (e.g., such as an M0 interconnect layer). In some embodiments, the metal lines may be electrically connected by a conductive via to respective underlying active regions, as described below. Additionally, a butted contact (BCT) 345 may be formed to electrically connect a gate and source/drain of respective transistors, as described herein. In some embodiments, the metal line 352 may be electrically connected to underlying active region 302B (including a source of the transistor P1) and to the power supply ($V_{CC}$). The metal line 354 may be electrically connected to underlying active region 302B (including a drain of the transistor P3) and provides the write bit-line (WBL). The metal line 356 is electrically connected to underlying active region 304B (including the source of the transistor P2) and to the power supply ($V_{CC}$). The metal line 358 is electrically connected to the underlying active region 306B (including the source of the transistor P5) and provides the write word-line bar (WWLB). The gate structure 346 (gate of transistor P4) is electrically connected, by way of the BCT 345, to metal line 360, which contacts underlying active region 306B (including a drain of transistor P5). In some embodiments, the gate structure 344 (gate of transistor P3) and the gate structure 346 (gate of transistor P4) are also electrically connected, for example, through an overlying interconnect layer (e.g., such as M0, M1, M2, or other metal interconnect layer) of a multi-layer interconnect structure. For clarity of discussion, not all of the connections shown in the circuit diagram of FIG. 2 may be shown in the layout views 300A, 300B of FIGS. 3A and 3B. However, it will be understood that any such connections not explicitly shown may be formed through an appropriate back-end-of-line metal layer (e.g., such as M0, M1, M2, or other interconnect layer).

During read operations of the SRAM cell 200, the single-ended read-port 206 provides access to the storage portion of the SRAM cell 200. For example, during the read operation, the read bit-line (RBL) is pre-charged to $V_{DD}$. Afterwards, the read word line (RWL) is set to $V_{DD}$ for the selected SRAM cell 200 (thus activating transistor N6), while the read word line (RWL) is set to zero for other, unselected SRAM cells. The configuration of the single-ended read-port 206, in particular, serves to isolate (or decouple) the storage node QB of the SRAM cell 200 from the pre-charged RBL. If a logic "1" is stored in the storage node QB (thus activating transistor N5), the pre-charged RBL is discharged to logic "0" through now-active transistors N5, N6. Conversely, if a logic "0" is stored in the storage node QB (thus deactivating transistor N5), the pre-charged RBL remains floating at $V_{DD}$ due to the inactive transistor N5. Generally, and as previously noted, the single-ended read-port 206 may be configured to mitigate a read disturb.

During the write operation of the SRAM cell 200, incoming data is transferred to the write bit-line (WBL) and incoming complementary data is transferred to the write bit-line bar (WBLB). The transistor P5 (of a selected column) is then initially activated by setting the enable line (EN_P) to zero (logic "0"). Thereafter, the write word-line (WWL) and the write word-line bar (WWLB), of a selected row, are set to $V_{DD}$) (logic "1") and zero (logic "0"), respectively, within a time period of a pulse of the enable line (EN_P) to activate the pass-gate transistors N3, P3, N4, P4. In particular, by implementing the transistor P5, the SRAM cell 200 is configured to activate the transistors P3, P4 only during the write operation.

Figure 4:
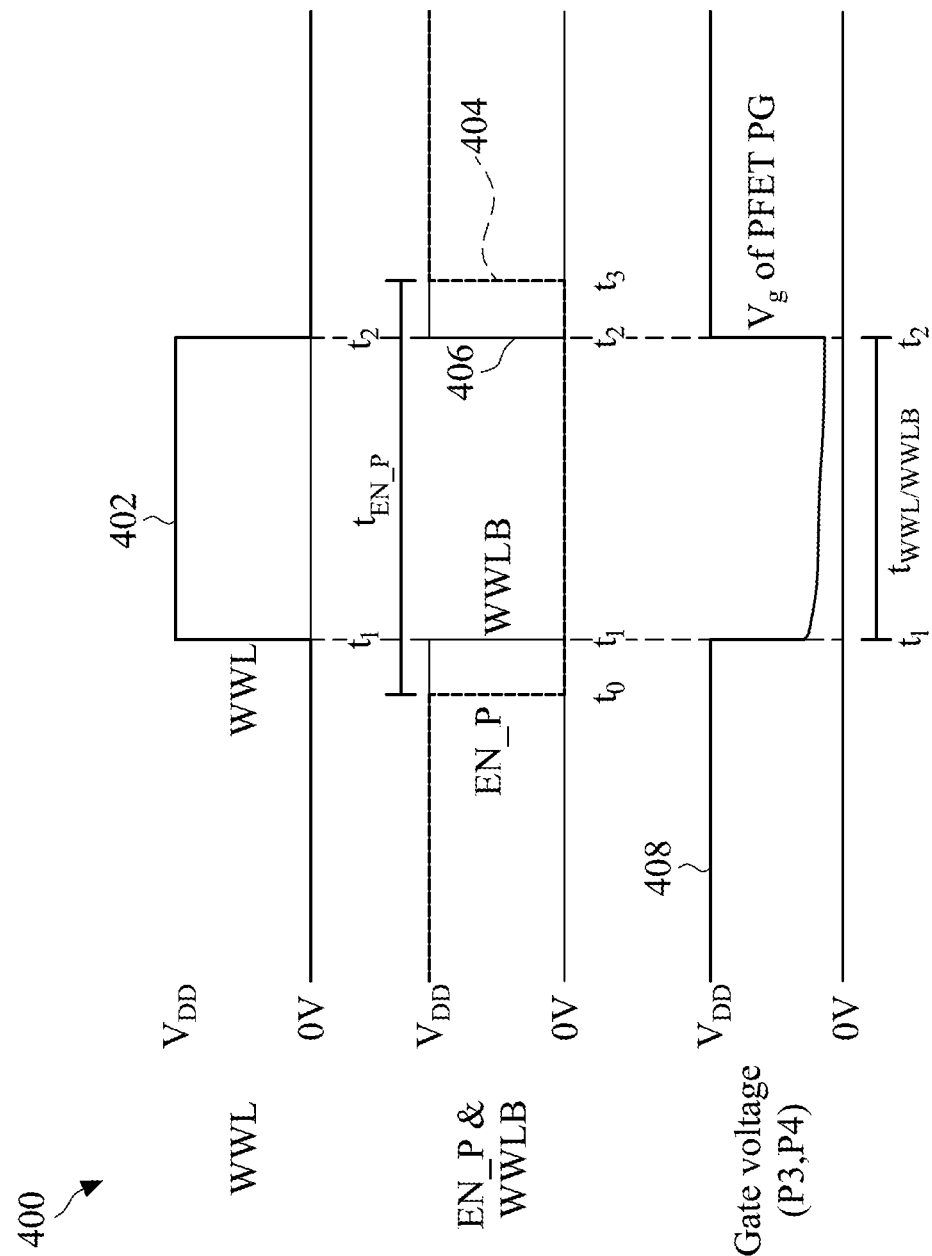
FIG. 4 shows a timing diagram including timing signals for various nodes of an SRAM cell, such as the SRAM cell of FIG. 2, illustrating a exemplary write operation of the SRAM cell, in accordance with some embodiments.

To further illustrate the write operation of the SRAM cell 200, reference is made to FIG. 4, which provides a timing diagram 400 showing a timing signal 402 for the write word-line (WWL), a timing signal 404 for the enable line (EN_P), a timing signal 406 for the write word-line bar (WWLB), and a timing signal 408 for a gate voltage of the P-type pass-gate transistors P3, P4. As shown, at time t0 and prior to setting WWL and WWLB, the enable line (EN_P) is switched from $V_{DD}$ to zero to activate the transistor P5. Prior to and immediately following time to, the write word-line (WWL) is set to zero (inactivating transistors N3, N4) and the write word-line bar (WWLB) is set to $V_{DD}$ (inactivating transistors P3, P4). Thereafter, at time t1, the write word-line (WWL) is set to $V_{DD}$ (activating transistors N3, N4) and the write word-line bar (WWLB) is set to zero (activating transistors P3, P4). The gate voltage response of the transistors P3, P4, as a result of setting the write word-line bar (WWLB) to zero, is shown in the timing signal 408. For unselected SRAM cells, the write word-line (WWL) is set to zero and the write word-line bar (WWLB) is set to $V_{DD}$. Then, at time t2, the write word-line (WWL) is set to zero (inactivating transistors N3, N4) and the write word-line bar (WWLB) is set to $V_{DD}$ (inactivating transistors P3, P4). The gate voltage response of the transistors P3, P4, as a result of setting the write word-line bar (WWLB) to $V_{DD}$, is shown in the timing signal 408. Thereafter, at time t3, the enable line (EN_P) is switched from zero to $V_{DD}$ to inactivate the transistor P5. Immediately prior to and following time t3, the write word-line (WWL) is set to zero (inactivating transistors N3, N4) and the write word-line bar (WWLB) is set to $V_{DD}$) (inactivating transistors P3, P4). In view of the above, a period of time that the enable line (EN_P) is set to zero ($t_{EN\_P}$) may be defined as a difference between times t3 and t0. In some cases, the time $t_{EN\_P}$ may be referred to as a pulse width of the enable line (EN_P). Likewise, a period of time that the write word-line (WWL) is set to $V_{DD}$ and the write word-line bar (WWLB) is set to zero ($t_{WWL/WWLB}$), which also corresponds to a period of time that the gate voltage of the transistors P3, P4 is low (e.g., zero or approximately zero), may be defined as a difference between times t2 and t1. In some cases, the time $t_{WWL/WWLB}$ may be referred to as a pulse width of the write word-line (WWL) or the write word-line bar (WWLB). In various embodiments, the time $t_{EN\_P}$ is greater than the time $t_{WWL/WWLB}$, so that it may be said that the write word-line (WWL) is set to $V_{DD}$ and the write word-line bar (WWLB) is set to zero within the period of time of the pulse width of the enable line (EN_P). In the above example, it is also noted that the write word-line bar (WWLB) signal may be substantially equal to a complement (or an inverse) of the write word-line (WWL) signal.

Regarding the write ability of the SRAM cell 200, it is noted that the combination of pass-gate transistors N3, P3 may effectively operate as a first transmission gate 207 coupled to the storage node Q, and the combination of pass-gate transistors N4, P4 may effectively operate as a second transmission gate 209 coupled to the storage node QB. Generally, in a transmission gate, a P-type transistor passes a strong logic "1" but a poor logic "0", and an N-type transistor passes a strong logic "0" but a poor logic "1". In some examples, both N-type and P-type transistors of the transmission gate may operate simultaneously. For the SRAM cell 200, and because of the effective first and second transmission gates 207, 209, the write bit-line (WBL) and the write bit-line bar (WBLB) can quickly flip a state of the SRAM cell 200. Stated another way, data stored within the SRAM cell 200 (or a state of the SRAM cell 200) can be quickly and efficiently flipped (e.g., from logic "1" to logic "0", or from logic "0" to logic "1") by writing a strong logic "0" using the N-type pass-gate transistors N3, N4 and by writing a strong logic "1" using the P-type pass-gate transistors P3, P4. In at least some existing implementations, for example in at least some existing 6T or 8T SRAM cells, P-type transistors that operate as transistors P3, P4 of the SRAM cell 200 are lacking. As a result, such existing implementations may only be able to write a strong logic "0" (using N-type pass-gate transistors) and not a strong logic "1". In contrast, the SRAM cell 200, which effectively has a first transmission gate 207 and a second transmission gate 209 on opposing sides of the storage portion of the SRAM cell 200, provides a significantly enhanced write ability and write margin (e.g., about 2.5× as compared to a 6T or an 8T SRAM cell).

Figure 5:
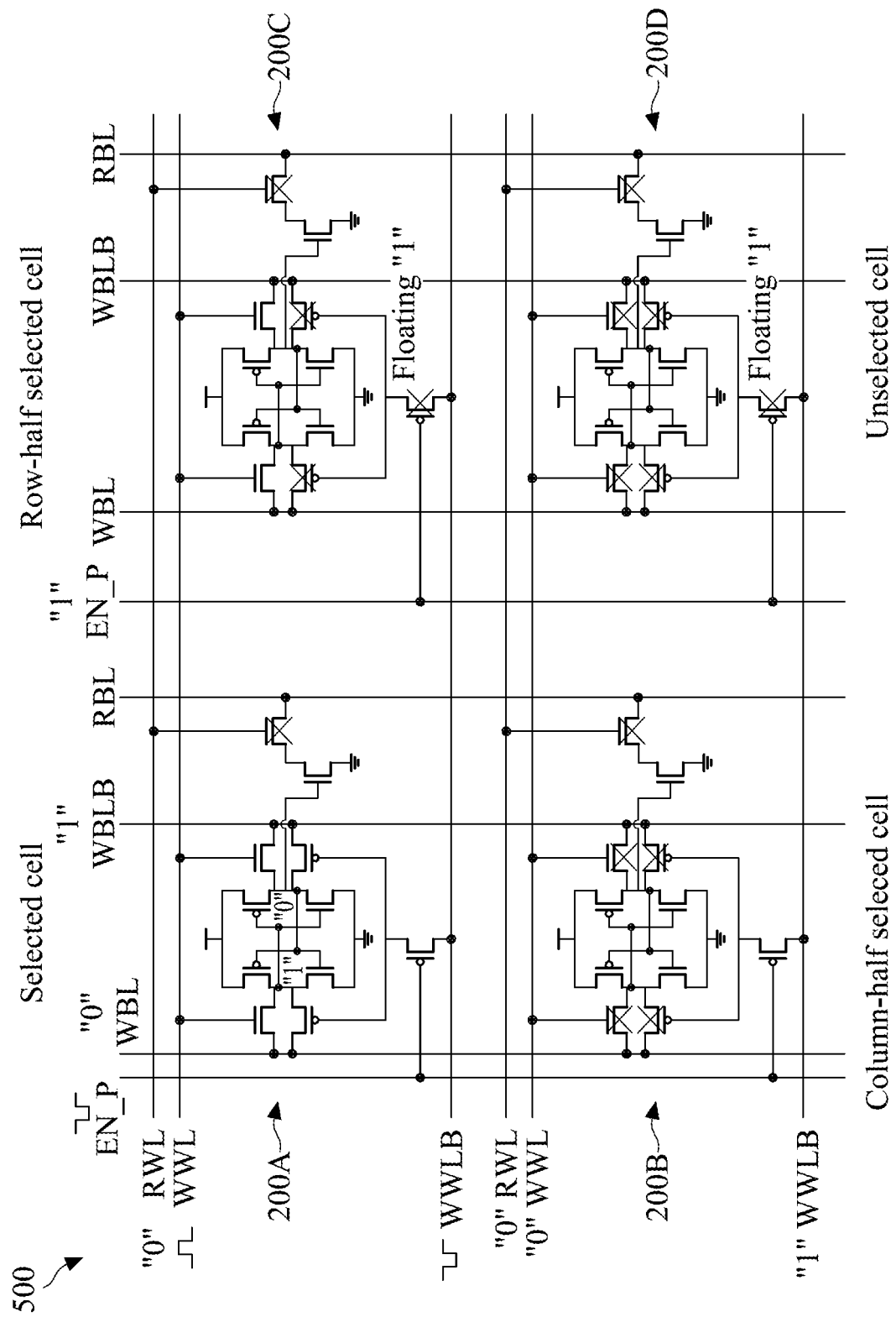
FIG. 5 provides an exemplary circuit diagram of an SRAM cell array, in accordance with some embodiments.

In addition to the negligible read disturb provided for by the single-ended read-port 206, the SRAM cell 200 can provide enhanced write ability without sacrificing the write half-selected disturb. Stated another way, the enhanced write ability of the SRAM cell 200 can be provided without exacerbating the write half-selected disturb issue. To elaborate on this point, reference is made to FIG. 5, which provides an exemplary circuit diagram of an SRAM cell array 500. In some embodiments, the SRAM cell array 500 comprises a plurality of SRAM cells 200A, 200B, 200C, 200D (which may substantially the same as the SRAM cell 200), arranged in rows and columns, to provide the SRAM cell array 500. As shown, a first enable line (EN_P) is electrically connected to SRAM cells 200A, 200B (e.g., to a gate of transistors P5) within a first column, and a second enable line (EN_P) is electrically connected to SRAM cells 200C, 200D (e.g., to a gate of transistors P5) within a second column. A first write bit-line (WBL) is electrically connected to SRAM cells 200A, 200B (e.g., to transmission gates 207) within a first column, and a second write bit-line (WBL) is electrically connected to SRAM cells 200C, 200D (e.g., to transmission gates 207) within a second column. Similarly, a first write bit-line bar (WBLB) is electrically connected to SRAM cells 200A, 200B (e.g., to transmission gates 209) within a first column, and a second write bit-line bar (WBLB) is electrically connected to SRAM cells 200C, 200D (e.g., to transmission gates 209) within a second column. A first read bit-line (RBL) is electrically connected to SRAM cells 200A, 200B (e.g., to a drain of transistors N6) within a first column, and a second read bit-line (RBL) is electrically connected to SRAM cells 200C, 200D (e.g., to a drain of transistors N6) within a second column. Further, a first read word line (RWL) is electrically connected to SRAM cells 200A, 200C (e.g., to a gate of transistors N6) within a first row, and a second read word line (RWL) is electrically connected to SRAM cells 200B, 200D (e.g., to a gate of transistors N6) within a second row. A first write word-line (WWL) is electrically connected to SRAM cells 200A, 200C (e.g., to gates of transistors N3, N4) within a first row, and a second write word-line (WWL) is electrically connected to SRAM cells 200B, 200D (e.g., to gates of transistors N3, N4) within a second row. In addition, a first write word-line bar (WWLB) is electrically connected to SRAM cells 200A, 200C (e.g., to gates of transistors P3, P5 if transistor P5 is active) within a first row, and a second write word-line bar (WWLB) is electrically connected to SRAM cells 200B, 200D (e.g., to gates of transistors P3, P5 if transistor P5 is active) within a second row.

As one example, consider that SRAM cell 200A is a selected cell during a write operation. Incoming data is transferred to the first write bit-line (WBL) and incoming complementary data is transferred to the first write bit-line bar (WBLB), within the first column of the SRAM cell array 500. The transistors P5 (of SRAM cells 200A, 200B of the first column) are activated by setting the first enable line (EN_P) to zero. The SRAM cell 200B may thus be referred to as a column-half selected cell. Thereafter, the first write word-line (WWL) and the first write word-line bar (WWLB), of the first row, are set to $V_{DD}$ and zero, respectively, within a time period of a pulse of the first enable line (EN_P) to activate the transmission gate 207 (transistors N3, P3) and the transmission gate 209 (transistors N4, P4) of the selected SRAM cell 200A. During the write operation, the first write word-line (WWL) being set to $V_{DD}$ will also activate the transistors N3, N4 of the SRAM cell 200C, causing the SRAM cell 200C to perform a dummy read operation. The SRAM cell 200C may thus be referred to as a row-half selected cell. However, because the transistors P5 (of SRAM cells 200C, 200D of the second column) are inactivated by setting the second enable line (EN_P) to logic "1", the first write word-line bar (WWLB) being set to zero will not activate the transistors P3, P4 of the SRAM cell 200C (the transistors P3, P4 of the SRAM cell 200C will remain inactive). As a result, the write half-selected disturb (e.g., of the SRAM cell 200C, in this example) will be determined by a strength ratio (drive current ratio) of the N-type pass-gate transistors (transistors N3, N4) and the N-type pull-down transistors (N1, N2) of the SRAM cell 200C. In various embodiments, the strength ratio should be sufficiently large so as to ensure that a write disturbance does not occur (e.g., within the SRAM cell 200C, in this example). The SRAM cell 200D, having no active row or column lines, will remain as an unselected cell.

As previously discussed, the disclosed SRAM cell 200 (or SRAM cell array) and peripheral circuits can be used to implement SRAM-based compute-in-memory (CIM) devices, in accordance with various embodiments. In particular, by leveraging the P-type transistors P3, P4 of the SRAM cell 200, the disclosed SRAM device demonstrates a capability of modulating a strength of the pass-gate transistors, so that the write ability of the SRAM cell 200 can be adjusted, thereby enabling three reconfigurable schemes (e.g., for performing at least six types of logic gate functionalities) to implement the SRAM-based CIM device. In some embodiments, CIM-based processes may include both write and read operations. Further, the three reconfigurable schemes, described in more detail below, provide for the implementation of Boolean CIM functionality using a single bitcell. For clarity of discussion, a NAND logic gate (NAND gate) and a NOR logic gate (NOR gate) are used as examples to demonstrate the functionality of the disclosed SRAM-based CIM devices, including the principles by which the SRAM-based CIM devices may be reconfigured. As discussed further below, logic gate operations for an OR logic gate (OR gate), an AND logic gate (AND gate), an IMP logic gate (IMP gate), and an NIMP logic gate (NIMP gate) may share a similar concept, as that described for the NAND and NOR gates, to provide the reconfigurable SRAM-based CIM devices.

Figure 6:
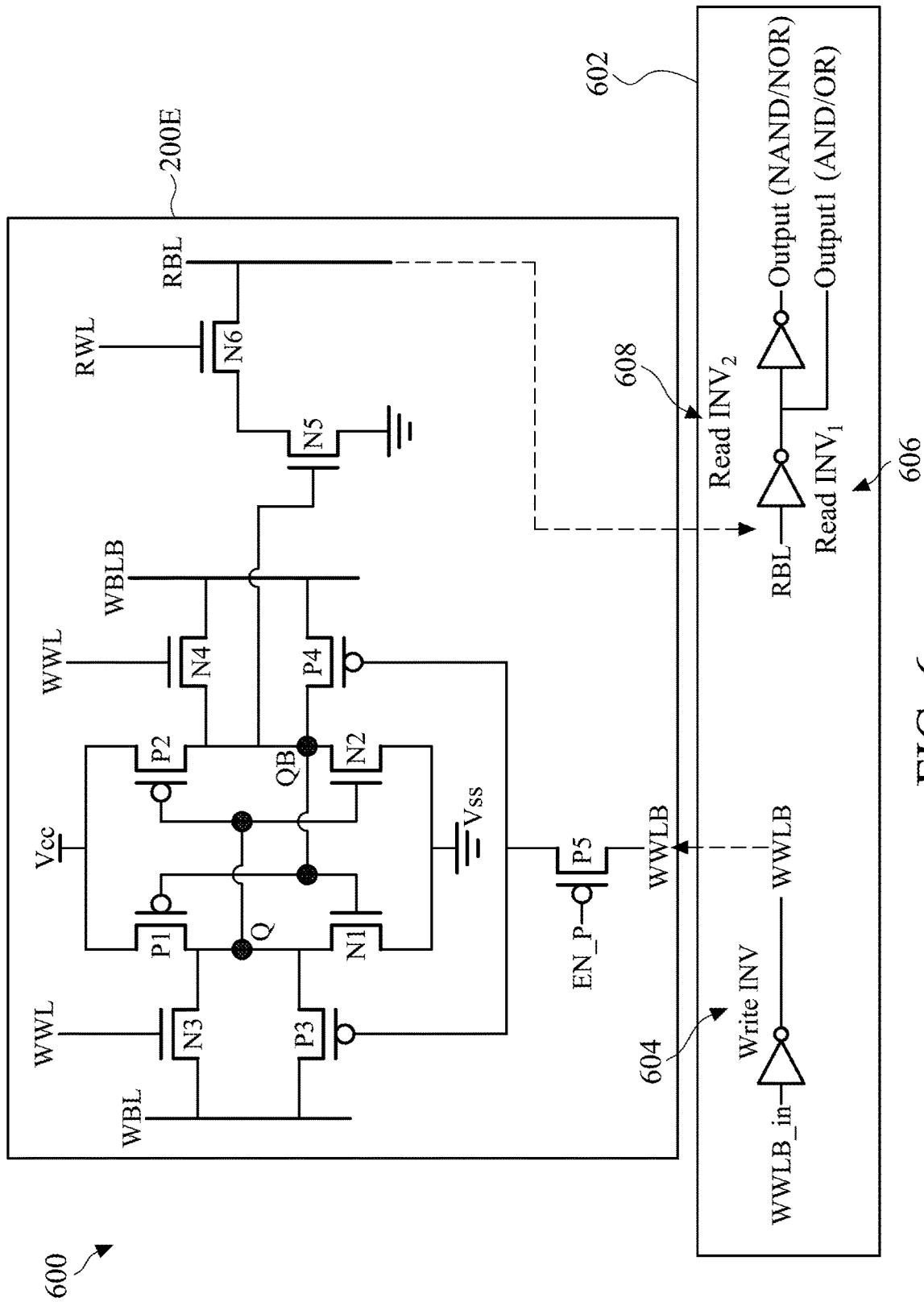
FIG. 6 illustrates an SRAM-based compute-in-memory (CIM) device, in accordance with some embodiments.

Regarding the inputs and outputs of the disclosed SRAM-based CIM device, reference is made to FIG. 6, which illustrates an SRAM-based CIM device 600. In some embodiments, the SRAM-based CIM device 600 may alternatively be referred to as an SRAM-based CIM module, SRAM-based CIM circuit, SRAM-based CIM unit, or other similar nomenclature. As shown in the illustrated example, the SRAM-based CIM device 600 may include an SRAM cell 200E (which may be substantially the same as the SRAM cell 200, discussed above) and peripheral circuitry 602. In some embodiments, the peripheral circuitry 602 may include a write inverter 604, a first read inverter 606, and a second read inverter 608.

As shown, and in some embodiments, an output of the write inverter 604 is coupled to the source of the transistor P5 to provide the write word-line bar (WWLB) signal. Also, in an example, the read bit-line (RBL), which is electrically connected to the drain of the transistor N6, is also electrically connected to an input of the first read inverter 606. In particular, due to the different polarities (e.g., N-type and P-type) of the pass-gate transistors N3, P3 and the pass-gate transistors N4, P4, the write word-line bar (WWLB) signal is provided by a WWLB_in signal electrically connected to an input to the write inverter 604, which in turn provides the WWLB signal at the output of the write inverter 604. Thus, the write inverter 604 can be used to provide a proper input polarity for the P-type pass-gate transistors P3, P4. Also, since the input of the first read inverter 606 is electrically connected to the read bit-line (RBL), an output of the first read inverter 606 goes low (e.g., logic "0") if the read bit-line (RBL) remains high (e.g., logic "1"). Further, the output of the first read inverter 606 is electrically connected to an input of the second read inverter 608. Thus, an output of the second read inverter 608 (or the output of the cascaded first and second read inverters 606, 608) can be used to mimic the operation of NAND/NOR gates. Accordingly, the input signals (or input nodes) used to perform NAND and NOR gate operations are WWL and WWLB_in, and the output signal (or output node), which provides NAND/NOR output signals, is the output of the second read inverter 608. It is noted that the counterpart logic gates (e.g., AND/OR) can also be distinguished by switching the initial states of storage nodes Q and QB, and the polarity of WBL and WBLB, without the introduction of both the first read inverter 606 and the second read inverter 608, or by using the output for a different one of the first and second read inverters 606, 608 as providing the output signals for different types of logic gates. For example, as shown in FIG. 6, the output of the first read inverter 606 may be used to provide AND/OR output signals. Generally, and in accordance with various embodiments, use of the read inverters (e.g., such as the first read inverter 606 and the second read inverter 608) provides for quick data sensing. In this example, it is also noted that the write word-line bar (WWLB) signal may not be equal to a complement (or an inverse) of the write word-line (WWL) signal. It is further noted that after performing any particular logic function, and in some embodiments, the states of storage nodes Q and QB may need to be written back to a logic "1" and logic "0", respectively, for a next CIM period.

Figure 7:
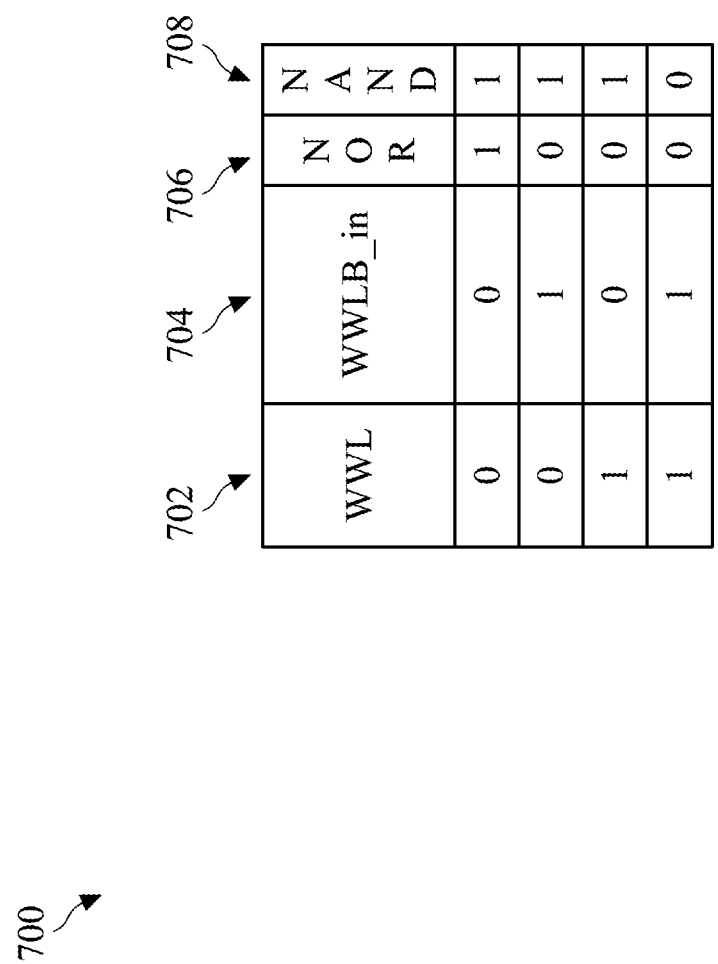
FIG. 7 illustrates an exemplary truth table for a NOR gate and a NAND gate, implemented using the SRAM-based CIM device of FIG. 6, in accordance with some embodiments.

FIG. 7 illustrates an exemplary truth table 700 for a NOR gate and a NAND gate, that may be implemented using the SRAM-based CIM device 600, as discussed above. The truth table 700 includes a column 702 corresponding to a first input signal (WWL), a column 704 corresponding to a second input signal (WWLB_in), a column 706 corresponding to a NOR gate output, and a column 708 corresponding to a NAND gate output. As shown, when the first input signal (WWL) and second input signal (WWLB_in) are both low (logic "0"), the NOR gate output and the NAND gate output are both high (logic "1"). When the first input signal (WWL) is low (logic "0") and the second input signal (WWLB_in) is high (logic "1"), the NOR gate output is low (logic "0") and the NAND gate output is high (logic "1"). When the first input signal (WWL) is high (logic "1") and the second input signal (WWLB_in) is low (logic "0"), the NOR gate output is low (logic "0") and the NAND gate output is high (logic "1"). When the first input signal (WWL) and second input signal (WWLB_in) are both high (logic "1"), the NOR gate output and the NAND gate output are both low (logic "0"). It will be understood that while the SRAM-based CIM device 600 can be used to implement a variety of logic functions, in some embodiments a single logic function may be implemented at a given time for a given bitcell. To be sure, in some cases, more than one logic function may be implemented at a given time for a given bitcell (e.g., such as using outputs of each of the first read inverter 606 and the second read inverter 606 as corresponding to outputs of different logic gates).

As previously noted, the SRAM-based CIM device disclosed herein can be used to implement three reconfigurable schemes to perform at least six types of logic gate functionalities. By way of example, the three reconfigurable schemes may be achieved by: (1) modulation of a pulse width of the input signals (WWL and WWLB_in); (2) modulation of a pulse amplitude of the input signals (WWL and WWLB_in); and (3) modulation of the bias conditions for the write bit-line (WBL) and the write bit-line bar (WBLB).

Figure 8B:
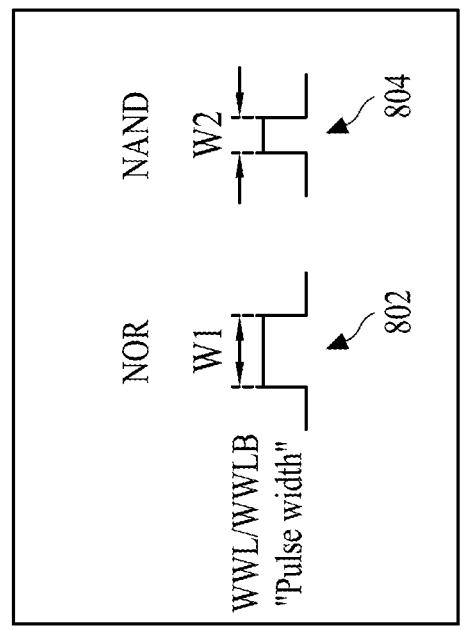
FIGS. 8A, 8B, 8C, and 8D illustrate an SRAM cell, exemplary input signals, truth tables, and timing diagrams for a first reconfigurable scheme of the SRAM-based CIM device of FIG. 6, in accordance with some embodiments.
Figure 8A:
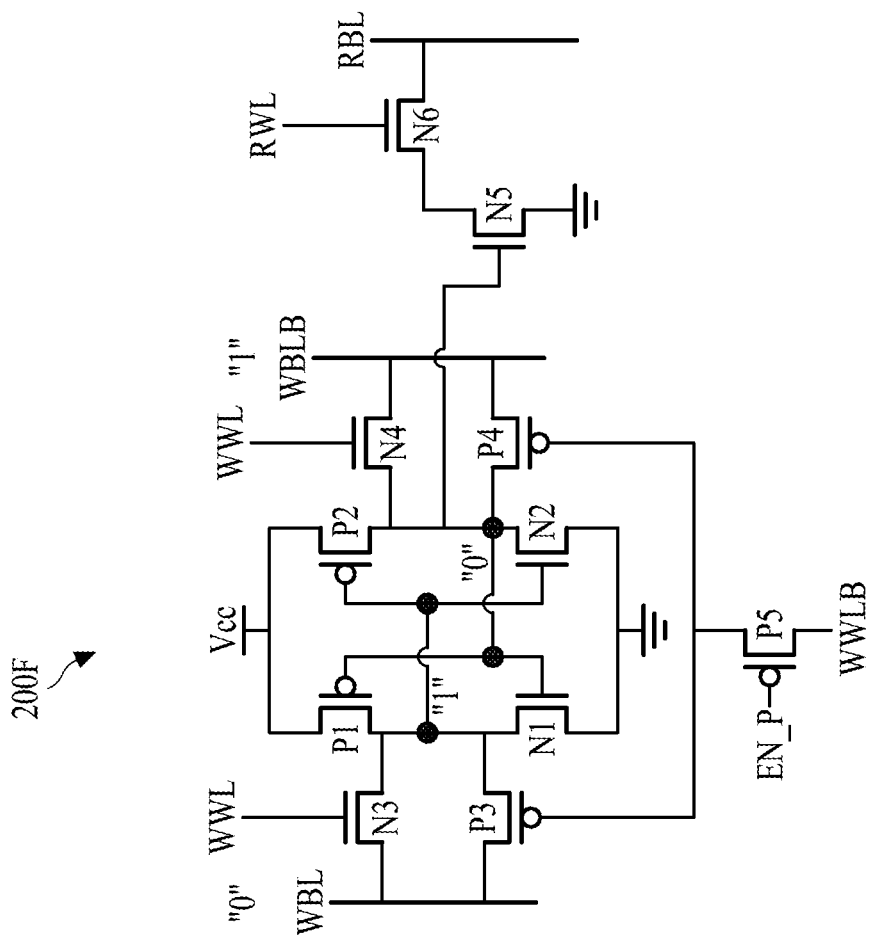
Figure 8C:
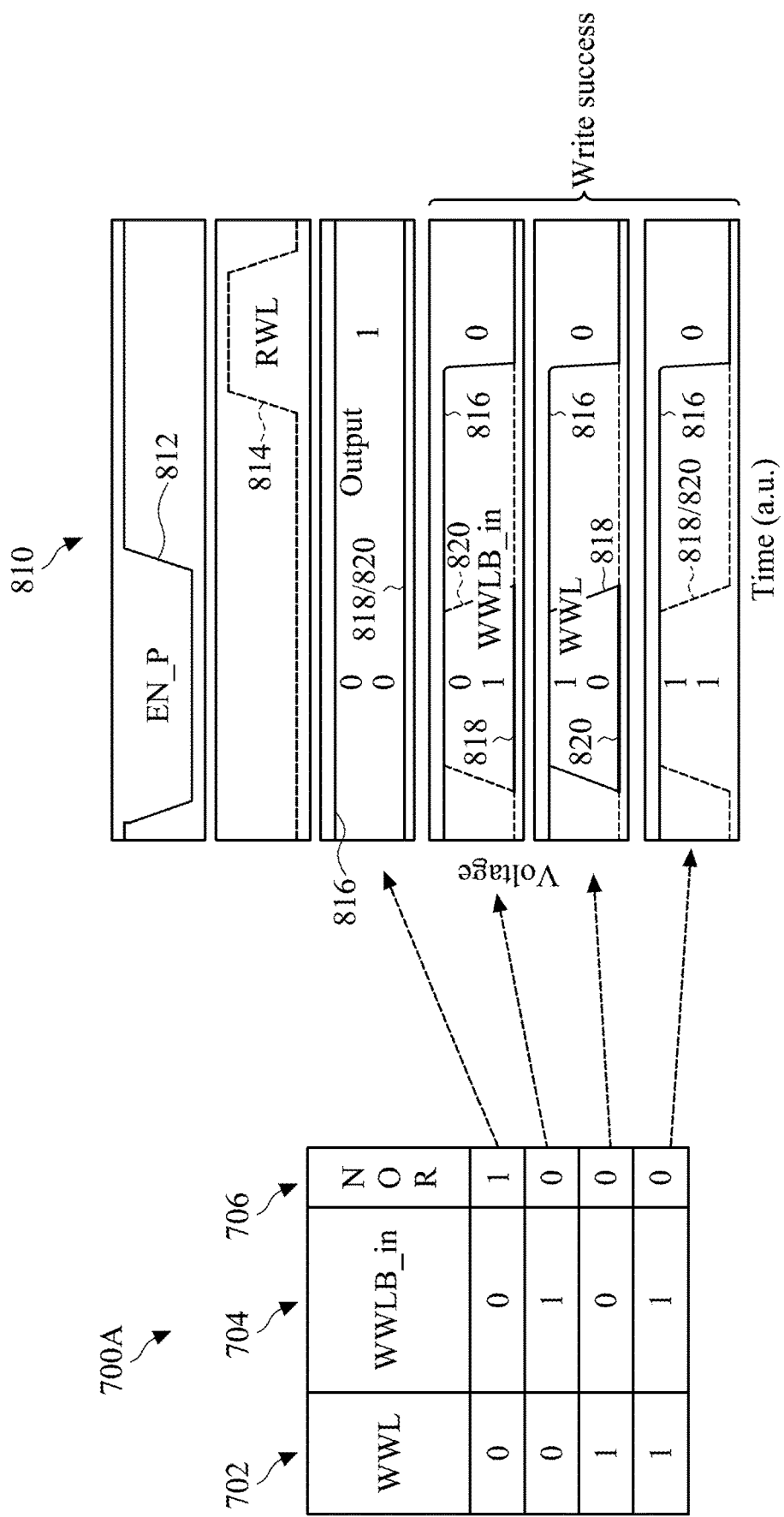
Figure 8D:
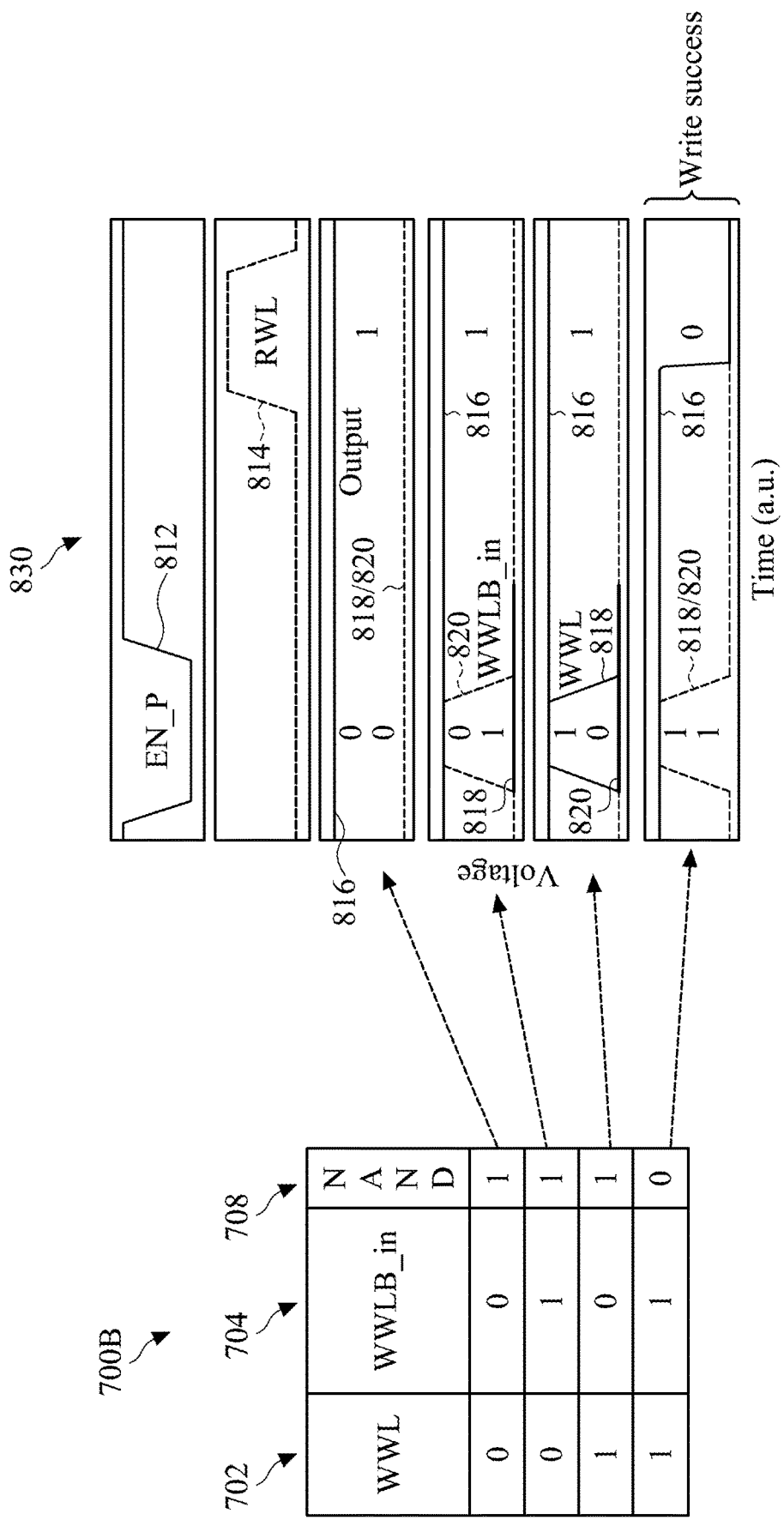

Referring now to FIGS. 8A-8D, the first reconfigurable scheme is described in more detail. FIG. 8A illustrates an SRAM cell 200F, which may be substantially the same as the SRAM cell 200, discussed above. FIG. 8B qualitatively illustrates a pulse 802 of an input signal for a NOR gate operation and a pulse 804 of the input signal for a NAND gate operation. As shown, a pulse width W1 of the pulse 802 for NOR gate operation is greater than a pulse width W2 of the pulse 804 for NAND gate operation. FIG. 8C illustrates a timing diagram 810 and a truth table 700A. The truth table 700A includes the column 702 corresponding to the first input signal (WWL), the column 704 corresponding to the second input signal (WWLB_in), and the column 706 corresponding to the NOR gate output, as described above with reference to FIG. 7. The timing diagram 810 illustrates, among other details, the behavior of the various input and output signals of the SRAM-based CIM when used to implement a NOR gate in accordance with the first reconfigurable scheme. FIG. 8D illustrates a timing diagram 830 and a truth table 700B. The truth table 700B includes the column 702 corresponding to the first input signal (WWL), the column 704 corresponding to the second input signal (WWLB_in), and the column 708 corresponding to the NAND gate output, as described above with reference to FIG. 7. The timing diagram 830 illustrates, among other details, the behavior of the various input and output signals of the SRAM-based CIM when used to implement a NAND gate in accordance with the first reconfigurable scheme.

In operation, still with reference to the first reconfigurable scheme, the initial states of storage nodes Q and QB are set as logic "1" and logic "0", respectively, by setting the WBL and WBLB to logic "1" and logic "0", respectively, to write the desired initial states to the storage nodes Q and QB. After setting the initial states of the storage nodes Q. QB to logic "1" and logic "0", the WBL and WBLB may be set to logic "0" and logic "1", respectively. During a write operation, the pulse width of the input signals (WWL, WWLB_in) determines whether the SRAM-based CIM device will operate as a NOR gate or as a NAND gate. For NOR gate operation, the pulse width (or writing pulse width) should be set long enough to make sure the data can be written successfully by only the N-type pass-gate transistors N3, N4 or the P-type pass-gate transistors P3, P4. Conversely, for NAND gate operation, the pulse width (or writing pulse width) should be set short enough so that the stored data cannot be flipped by only the N-type pass-gate transistors N3, N4 or the P-type pass-gate transistors P3, P4. Rather, for NAND gate operation, and only when all the writing pass-gate transistors N3, N4, P3, P4 are simultaneously activated, can the data be written successfully. During the read operation, the output data can be read and sensed out through the first read inverter 606 and the second read inverter 608 (FIG. 6).

Returning to the timing diagram 810 of FIG. 8C, illustrated therein is a timing signal 812 for the enable line (EN_P), a timing signal 814 for the read word line (RWL), a timing signal 816 for the output of the NOR gate (which corresponds to column 706 of the truth table 700A), a timing signal 818 for the first input signal (WWL) of the NOR gate (which corresponds to column 702 of the truth table 700A), and a timing signal 820 for the second input signal (WWLB_in) of the NOR gate (which corresponds to column 704 of the truth table 700A). It is noted that activation of the first and/or second input signals (WWL, WWLB_in) occurs within the period of time of the pulse width of the enable line (EN_P), as previously referenced. The output of the NOR gate, which can be sensed at the output of the second read inverter 608 for NOR gate operation, is read when the read word line (RWL) is activated. As shown, when the first and second input signals (WWL, WWLB_in) are both low (logic "0"), the NOR gate output is high (logic "1"). When the first input signal (WWL) is low (logic "0") and the second input signal (WWLB_in) is high (logic "1"), the NOR gate output is low (logic "0"). When the first input signal (WWL) is high (logic "1") and the second input signal (WWLB_in) is low (logic "0"), the NOR gate output is low (logic "0"). When the first and second input signals (WWL, WWLB_in) are both high (logic "1"), the NOR gate output is low (logic "0").

With reference to the timing diagram 830 of FIG. 8D, illustrated therein is the timing signal 812 for the enable line (EN_P), the timing signal 814 for the read word line (RWL), the timing signal 816 for the output of the NAND gate (which corresponds to column 708 of the truth table 700B), the timing signal 818 for the first input signal (WWL) of the NAND gate (having a shorter pulse width than for NOR gate operation when activated, and which corresponds to column 702 of the truth table 700B), and the timing signal 820 for the second input signal (WWLB_in) of the NAND gate (having a shorter pulse width than for NOR gate operation when activated, and which corresponds to column 704 of the truth table 700B). Once again, the activation of the first and/or second input signals (WWL, WWLB_in) occurs within the period of time of the pulse width of the enable line (EN_P), as previously referenced. The output of the NAND gate, which can also be sensed at the output of the second read inverter 608 for NAND gate operation, is read when the read word line (RWL) is activated. As shown, when the first and second input signals (WWL, WWLB_in) are both low (logic "0"), the NAND gate output is high (logic "1"). When the first input signal (WWL) is low (logic "0") and the second input signal (WWLB_in) is high (logic "1"), the NAND gate output is high (logic "1"). When the first input signal (WWL) is high (logic "1") and the second input signal (WWLB_in) is low (logic "0"), the NAND gate output is high (logic "1"). When the first and second input signals (WWL, WWLB_in) are both high (logic "1"), the NAND gate output is low (logic "0").

Figures 9A, 9B:
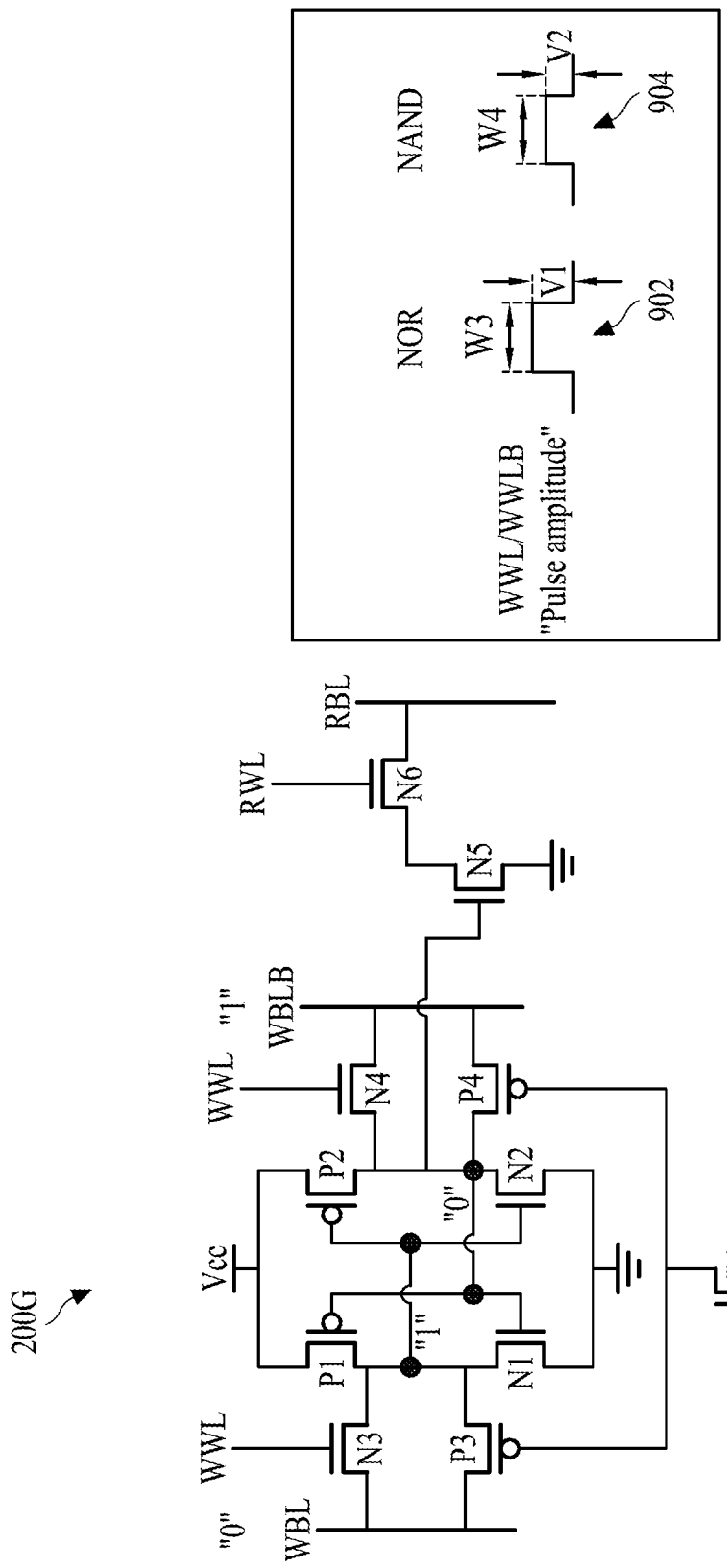
FIGS. 9A, 9B, 9C, and 9D illustrate an SRAM cell, exemplary input signals, truth tables, and timing diagrams for a second reconfigurable scheme of the SRAM-based CIM device of FIG. 6, in accordance with some embodiments.
Figure 9C:
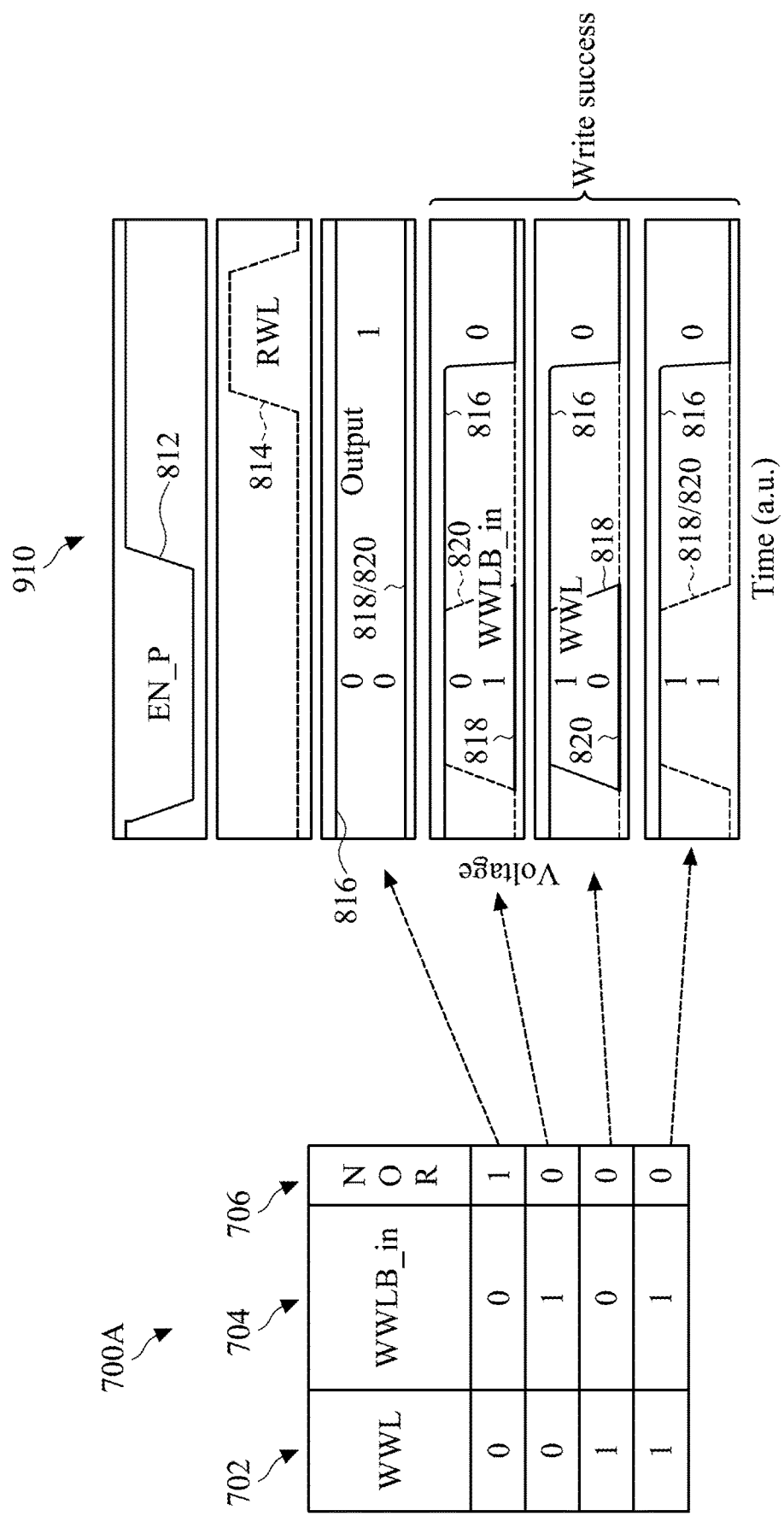
Figure 9D:
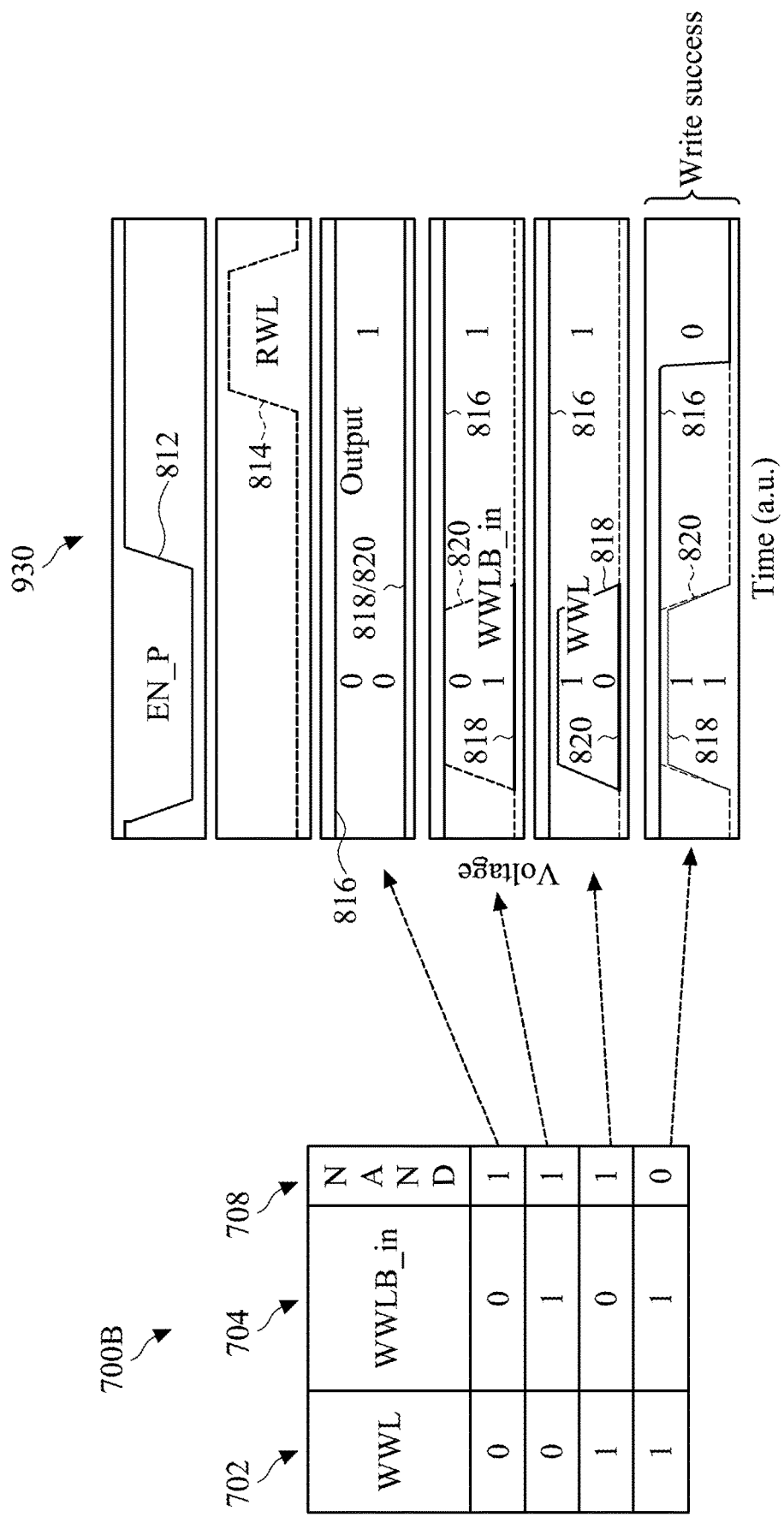

Referring now to FIGS. 9A-9D, the second reconfigurable scheme is described in more detail. FIG. 9A illustrates an SRAM cell 200G, which may be substantially the same as the SRAM cell 200, discussed above. FIG. 9B qualitatively illustrates a pulse 902 of an input signal for a NOR gate operation and a pulse 904 of the input signal for a NAND gate operation. As shown, a pulse amplitude V1 of the pulse 902 for NOR gate operation is greater than a pulse amplitude V2 of the pulse 904 for NAND gate operation. It is noted, that for this embodiment, a pulse width W3 of the pulse 902 for NOR gate operation may be substantially the same as a pulse width W4 of the pulse 904 for NAND gate operation. FIG. 9C illustrates a timing diagram 910 and the truth table 700A for NOR gate operation, as described above. The timing diagram 910 illustrates, among other details, the behavior of the various input and output signals of the SRAM-based CIM when used to implement a NOR gate in accordance with the second reconfigurable scheme. FIG. 9D illustrates a timing diagram 930 and the truth table 700B for NAND gate operation, as described above. The timing diagram 930 illustrates, among other details, the behavior of the various input and output signals of the SRAM-based CIM when used to implement a NAND gate in accordance with the second reconfigurable scheme.

In operation, still with reference to the second reconfigurable scheme, the initial states of storage nodes Q and QB are set as logic "1" and logic "0", respectively, by setting the WBL and WBLB to logic "1" and logic "0", respectively, to write the desired initial states to the storage nodes Q and QB. After setting the initial states of the storage nodes Q. QB to logic "1" and logic "0", the WBL and WBLB may be set to logic "0" and logic "1", respectively. During a write operation, the pulse amplitude of WWL and WWLB, and thus of the input signals (WWL, WWLB_in), determines whether the SRAM-based CIM device will operate as a NOR gate or as a NAND gate. For NOR gate operation, the pulse amplitude (or writing pulse amplitude) is set to $V_{DD}$ to make sure the data can be written successfully by only the N-type pass-gate transistors N3, N4 or the P-type pass-gate transistors P3, P4. Conversely, for NAND gate operation, the pulse amplitude (or writing pulse amplitude) is set lower than $V_{DD}$ so that the stored data cannot be flipped by only the N-type pass-gate transistors N3, N4 or the P-type pass-gate transistors P3, P4. Rather, for NAND gate operation, and only when all the writing pass-gate transistors N3, N4, P3, P4 are simultaneously activated, can the data be written successfully. It is noted that to generate the lower writing pulse amplitude of WWLB, and thus of WWLB_in, the grounded voltage ($V_{SS}$) of the write inverter 604 (FIG. 6) can be raised to a higher value (e.g., $V_{DD}$-WWL voltage). During the read operation, the output data can be read and sensed out through the first read inverter 606 and the second read inverter 608 (FIG. 6).

Returning to the timing diagram 910 of FIG. 9C, illustrated therein is the timing signal 812 for the enable line (EN_P), the timing signal 814 for the read word line (RWL), the timing signal 816 for the output of the NOR gate (which corresponds to column 706 of the truth table 700A), the timing signal 818 for the first input signal (WWL) of the NOR gate (which corresponds to column 702 of the truth table 700A), and the timing signal 820 for the second input signal (WWLB_in) of the NOR gate (which corresponds to column 704 of the truth table 700A). As in prior examples, the activation of the first and/or second input signals (WWL, WWLB_in) occurs within the period of time of the pulse width of the enable line (EN_P). The output of the NOR gate, which can be sensed at the output of the second read inverter 608 for NOR gate operation, is read when the read word line (RWL) is activated. As shown, when the first and second input signals (WWL, WWLB_in) are both low (logic "0"), the NOR gate output is high (logic "1"). When the first input signal (WWL) is low (logic "0") and the second input signal (WWLB_in) is high (logic "1"), the NOR gate output is low (logic "0"). When the first input signal (WWL) is high (logic "1") and the second input signal (WWLB_in) is low (logic "0"), the NOR gate output is low (logic "0"). When the first and second input signals (WWL, WWLB_in) are both high (logic "1"), the NOR gate output is low (logic "0").

With reference to the timing diagram 930 of FIG. 9D, illustrated therein is the timing signal 812 for the enable line (EN_P), the timing signal 814 for the read word line (RWL), the timing signal 816 for the output of the NAND gate (which corresponds to column 708 of the truth table 700B), the timing signal 818 for the first input signal (WWL) of the NAND gate (having a lower writing pulse amplitude than for NOR gate operation when activated, and which corresponds to column 702 of the truth table 700B), and the timing signal 820 for the second input signal (WWLB_in) of the NAND gate (effectively having a lower writing pulse amplitude than for NOR gate operation when activated, and which corresponds to column 704 of the truth table 700B). In some examples, during NAND gate operation, the second input signal may be said to effectively have a lower writing pulse amplitude at least because when WWLB_in is set high (logic "1"), the value of WWLB_in may remain equal to $V_{DD}$ while the value of WWLB is reduced to a lower value (e.g., by way of the write inverter 604). As a result, the gates of the P-type pass-gate transistors P3, P4 can receive the reduced voltage value signal (WWLB). Once again, as shown in the timing diagram 930, the activation of the first and/or second input signals (WWL, WWLB_in) occurs within the period of time of the pulse width of the enable line (EN_P). The output of the NAND gate, which can also be sensed at the output of the second read inverter 608 for NAND gate operation, is read when the read word line (RWL) is activated. As shown, when the first and second input signals (WWL, WWLB_in) are both low (logic "0"), the NAND gate output is high (logic "1"). When the first input signal (WWL) is low (logic "0") and the second input signal (WWLB_in) is high (logic "1"), the NAND gate output is high (logic "1"). When the first input signal (WWL) is high (logic "1") and the second input signal (WWLB_in) is low (logic "0"), the NAND gate output is high (logic "1"). When the first and second input signals (WWL, WWLB_in) are both high (logic "1"), the NAND gate output is low (logic "0").

Figure 10C:
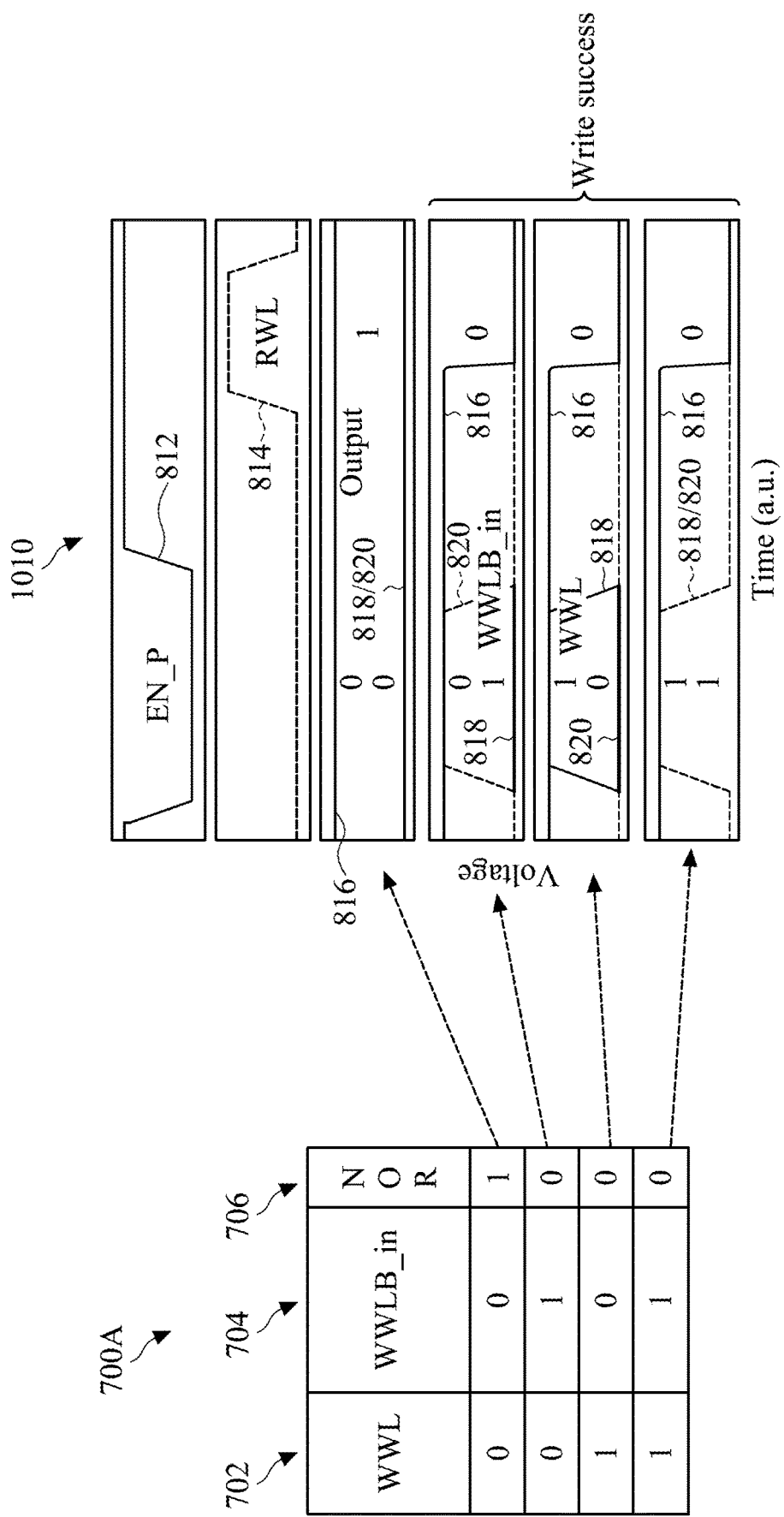
Figure 10D:
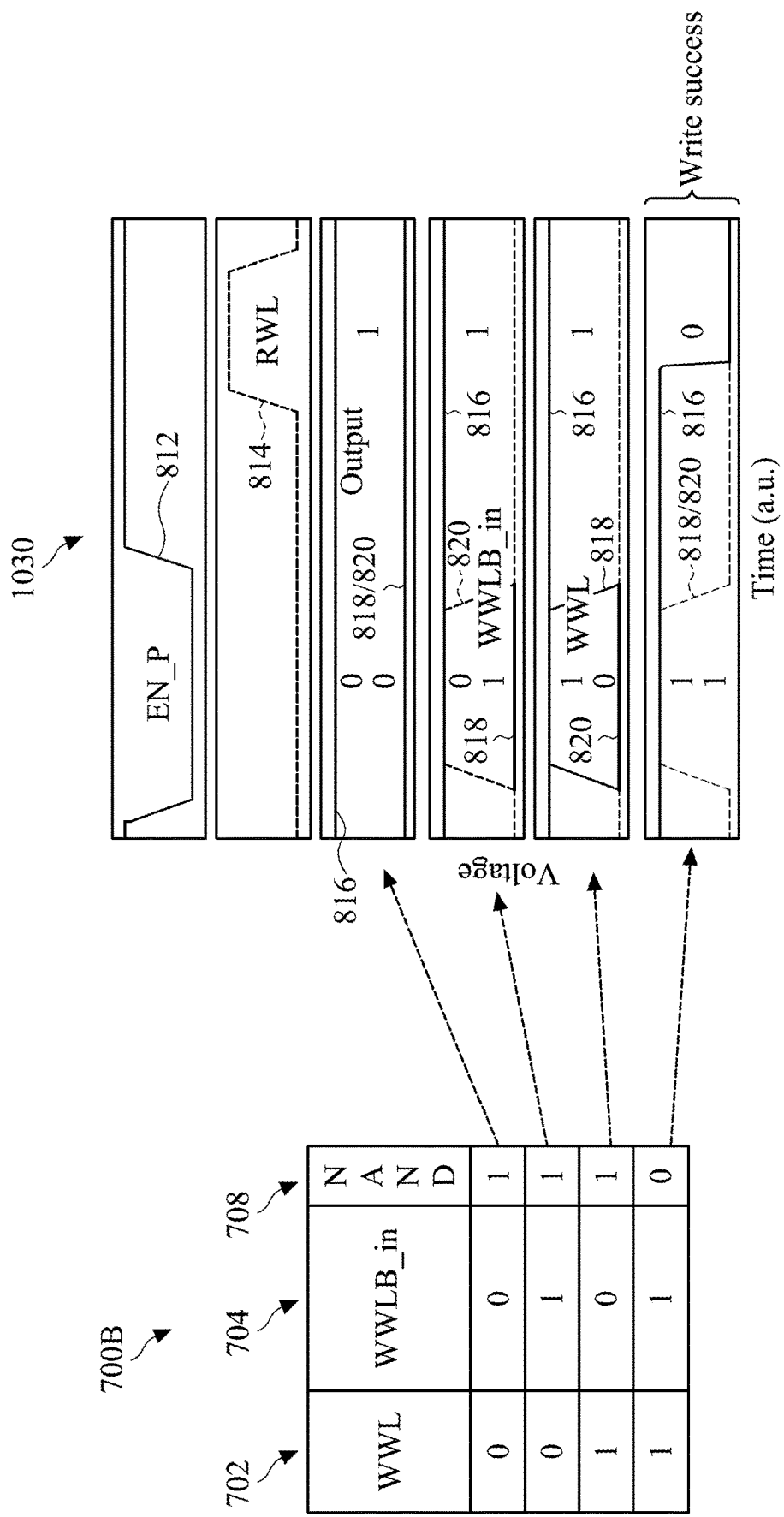

Referring now to FIGS. 10A-10D, the third reconfigurable scheme is described in more detail. FIG. 10A illustrates an SRAM cell 200H, which may be substantially the same as the SRAM cell 200, discussed above. FIG. 10B qualitatively illustrates a bias condition 1002 for WBL and WBLB for a NOR gate operation and a bias condition 1004 for WBL and WBLB for a NAND gate operation. As shown, in the bias condition 1002 for NOR gate operation, WBL is set low (logic "0") and WBLB is set high (logic "1"). In the bias condition 1004 for NAND gate operation, WBL is set to floating low (floating logic "0" or floating "0") and WBLB is set to floating high (floating logic "1" or floating "1"). FIG. 10C illustrates a timing diagram 1010 and the truth table 700A for NOR gate operation, as described above. The timing diagram 1010 illustrates, among other details, the behavior of the various input and output signals of the SRAM-based CIM when used to implement a NOR gate in accordance with the third reconfigurable scheme. FIG. 10D illustrates a timing diagram 1030 and the truth table 700B for NAND gate operation, as described above. The timing diagram 1030 illustrates, among other details, the behavior of the various input and output signals of the SRAM-based CIM when used to implement a NAND gate in accordance with the third reconfigurable scheme.

In operation, still with reference to the third reconfigurable scheme, the initial states of storage nodes Q and QB are set as logic "1" and logic "0", respectively. After setting the initial states of the storage nodes Q, QB to logic "1" and logic "0", the WBL and WBLB may be set to logic "0" and logic "1", respectively. During a write operation, the bias condition of WBL and WBLB, determines whether the SRAM-based CIM device will operate as a NOR gate or as a NAND gate. For NOR gate operation, WBL and WBLB are set to logic "0" and logic "1", respectively, to make sure the data can be written successfully by only the N-type pass-gate transistors N3, N4 or the P-type pass-gate transistors P3, P4. Conversely, for NAND gate operation, WBL and WBLB are set to floating "0" and floating "1", respectively, so that the stored data cannot be flipped by only the N-type pass-gate transistors N3, N4 or the P-type pass-gate transistors P3, P4. Rather, for NAND gate operation, and only when all the writing pass-gate transistors N3, N4, P3, P4 are simultaneously activated, can the data be written successfully. It is noted that when setting WBL to floating "0", WBL may first be set to "0" and then floated. Similarly, when setting WBLB to floating "1", WBLB may first be set to "1" and then floated. During the read operation, the output data can be read and sensed out through the first read inverter 606 and the second read inverter 608 (FIG. 6).

Returning to the timing diagram 1010 of FIG. 10C, illustrated therein is the timing signal 812 for the enable line (EN_P), the timing signal 814 for the read word line (RWL), the timing signal 816 for the output of the NOR gate (which corresponds to column 706 of the truth table 700A), the timing signal 818 for the first input signal (WWL) of the NOR gate (which corresponds to column 702 of the truth table 700A), and the timing signal 820 for the second input signal (WWLB_in) of the NOR gate (which corresponds to column 704 of the truth table 700A). Once again, the activation of the first and/or second input signals (WWL, WWLB_in) occurs within the period of time of the pulse width of the enable line (EN_P). The output of the NOR gate, which can be sensed at the output of the second read inverter 608 for NOR gate operation, is read when the read word line (RWL) is activated. Recall that for NOR gate operation, WBL and WBLB are set to logic "0" and logic "1", respectively. As shown, when the first and second input signals (WWL, WWLB_in) are both low (logic "0"), the NOR gate output is high (logic "1"). When the first input signal (WWL) is low (logic "0") and the second input signal (WWLB_in) is high (logic "1"), the NOR gate output is low (logic "0"). When the first input signal (WWL) is high (logic "1") and the second input signal (WWLB_in) is low (logic "0"), the NOR gate output is low (logic "0"). When the first and second input signals (WWL, WWLB_in) are both high (logic "1"), the NOR gate output is low (logic "0").

With reference to the timing diagram 1030 of FIG. 10D, illustrated therein is the timing signal 812 for the enable line (EN_P), the timing signal 814 for the read word line (RWL), the timing signal 816 for the output of the NAND gate (which corresponds to column 708 of the truth table 700B), the timing signal 818 for the first input signal (WWL) of the NAND gate (which corresponds to column 702 of the truth table 700B), and the timing signal 820 for the second input signal (WWLB_in) of the NAND gate (which corresponds to column 704 of the truth table 700B). Again, the activation of the first and/or second input signals (WWL, WWLB_in) occurs within the period of time of the pulse width of the enable line (EN_P). The output of the NAND gate, which can also be sensed at the output of the second read inverter 608 for NAND gate operation, is read when the read word line (RWL) is activated. Recall that for NAND gate operation, WBL and WBLB are set to floating "0" and floating "1", respectively. As shown, when the first and second input signals (WWL, WWLB_in) are both low (logic "0"), the NAND gate output is high (logic "1"). When the first input signal (WWL) is low (logic "0") and the second input signal (WWLB_in) is high (logic "1"), the NAND gate output is high (logic "1"). When the first input signal (WWL) is high (logic "1") and the second input signal (WWLB_in) is low (logic "0"), the NAND gate output is high (logic "1"). When the first and second input signals (WWL, WWLB_in) are both high (logic "1"), the NAND gate output is low (logic "0").

Thus, the SRAM-based CIM device disclosed herein can be used to implement three reconfigurable schemes to perform various logic gate functionalities using only a single SRAM bitcell. The reconfigurability of the SRAM-based CIM device, as described above, may be achieved by: (1) modulation of a pulse width of the input signals (WWL and WWLB_in); (2) modulation of a pulse amplitude of the input signals (WWL and WWLB_in); and (3) modulation of the bias conditions for the write bit-line (WBL) and the write bit-line bar (WBLB). Use of selected peripheral circuitry can also enable and enhance operation of the disclosed SRAM-based CIM device. For example, the write inverter 604 can be used to provide a proper input polarity for the P-type pass-gate transistors P3, P4, and the read inverters (e.g., such as the first read inverter 606 and the second read inverter 608) can be used to provide quick data sensing.

While the discussion of the three reconfigurable schemes primarily used the examples of NOR gates and NAND gates, operation of other logic gates may also be implemented, in accordance with various embodiments. For example, in addition to sensing NAND/NOR output signals at the output of the second read inverter 608, an output of an IMP gate may also be sensed at the output of the second read inverter 608, in some implementations. In another example, in addition to sensing AND/OR output signals at the output of the first read inverter 606, an output of an NIMP gate may also be sensed at the output of the first read inverter 606, in some implementations. AND/OR gate functionality can also be distinguished by switching the initial states of storage nodes Q and QB, and the polarity of WBL and WBLB, without the introduction of both the first read inverter 606 and the second read inverter 608. Thus, at least six types of logic gate functionalities may be implemented by way of the disclosed SRAM-based CIM device. Moreover, in some cases and by using different combinations of NAND gates, NOR gates, AND gates, and OR gates (e.g., each of which may be implemented using a single bitcell), XOR and XNOR logic gates may be implemented as well.

As a further summary of using the disclosed SRAM-based CIM device to perform the various logic gate functionalities using only a single bitcell, reference is made to FIG. 11A and FIG. 11B. FIG. 11A provides a table 1100 showing exemplary CIM settings for implementing different logic gates using the disclosed 11T CFET SRAM, and FIG. 11B provides a truth table 1150 for the different logic gates included in the table 1100. The logic gates included in the table 1100 are NOR, NAND, OR, AND, IMP, and NIMP. The reconfigurable schemes, as discussed above, can be selected from among pulse width modulation, pulse amplitude modulation, and WBL/WBLB bias condition. For each logic gate, the table 1100 shows the settings (reconfigurable settings), corresponding to each of the reconfigurable schemes, by which each respective logic gate is implemented. By way of example, the pulse width settings are shown as either "long" or "short", the pulse amplitude settings are shown as either "high" or "low", and the WBL/WBLB bias condition settings are shown as either "biased" or "floating". For each logic gate, the table 1100 also shows the relevant input/output signals of the logic gate. For the NOR gate, the settings for each of the three reconfigurable schemes are long (pulse width), high (pulse amplitude), and biased (WBL/WBLB bias condition), the input signals A/B are WWL and WWLB_in, and the output signal Y is the output of the second read inverter 608. For the NAND gate, the settings for each of the three reconfigurable schemes are short, low, floating, the input signals A/B are WWL and WWLB_in, and the output signal Y is the output of the second read inverter 608. For the OR gate, the settings for each of the three reconfigurable schemes are long, high, biased, the input signals A/B are WWL and WWLB_in, and the output signal Y is the output of the first read inverter 606. For the AND gate, the settings for each of the three reconfigurable schemes are short, low, floating, the input signals A/B are WWL and WWLB_in, and the output signal Y is the output of the first read inverter 606. For the IMP gate, the settings for each of the three reconfigurable schemes are short, low, floating, the input signals A/B are WWL and WWLB, and the output signal Y is the output of the second read inverter 608. For the NIMP gate, the settings for each of the three reconfigurable schemes are short, low, floating, the input signals A/B are WWL and WWLB, and the output signal Y is the output of the first read inverter 606. The truth table 1150 includes a column corresponding to input signal A, a column corresponding to input signal B, and columns corresponding to the output signals Y of the various logic gates such as a column corresponding to a NOR gate output, a column corresponding to a NAND gate output, a column corresponding to an OR gate output, a column corresponding to an AND gate output, a column corresponding to an IMP gate output, and a column corresponding to a NIMP gate output.

Figure 13:
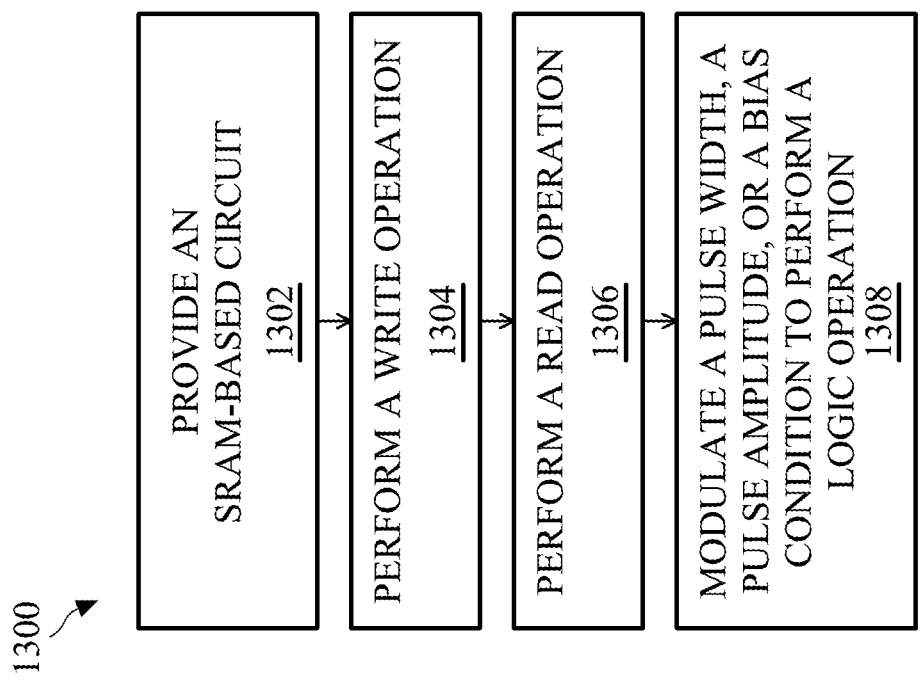
FIG. 13 is a flow chart of a method of operating an SRAM-based circuit, according to one or more aspects of the present disclosure.

In view of the above discussion, reference is now made to FIG. 13, which illustrates a method 1300 of operating an SRAM-based circuit, in accordance with some embodiments. It is noted that the steps of the method 1300, including any descriptions given with reference to the figures are merely exemplary and are not intended to be limiting beyond what is specifically recited in the claims that follow. In addition, it will be understood that additional steps may be implemented before, during, and after the method 1300, and some steps may be replaced, eliminated, or reordered in accordance with various embodiments of the method 1300.

The method 1300 begins at block 1302 where an SRAM-based circuit is provided. In an embodiment of block 1302, the SRAM-based circuit may include the SRAM cell 200, the SRAM cell array 500, the SRAM-based CIM device 600, or other SRAM-based device as shown and/or described herein. As an example, the SRAM-based circuit may include a first SRAM cell (e.g., such as the SRAM cell 200, 200A, 200E) including a cross-coupled pair of inverters (consisting of the inverter 202 and the inverter 204) that provide a storage portion of the first SRAM cell. The first SRAM cell further includes first N-type and P-type pass-gate transistors (pass-gate transistors N3, P3) coupled between a first side of the storage portion of the first SRAM cell and the write bit line (WBL). In addition, the first SRAM cell further includes second N-type and P-type pass-gate transistors (pass-gate transistors N4, P4) coupled between a second side of the storage portion of the first SRAM cell and the complementary write bit line (WBLB). In various embodiments, gates of the first N-type pass-gate transistor N3 and the second N-type pass-gate transistor N4 are coupled to a first write word line (WWL). In an embodiment, the first SRAM cell further includes a P-type transistor P5 coupled between gates of the first and second P-type pass-gate transistors P3, P4 and the second write word line (WWLB). As described above, a gate of the P-type transistor P5 is coupled to an enable signal (EN_P). In some examples, the first SRAM cell further includes a single-ended read port 206 coupled between a read bit line (RBL) and a second side of the storage portion of the first SRAM cell.

In a further embodiment of block 1302, the SRAM-based circuit may include a second SRAM cell (e.g., such as SRAM cell 200B, 200C, 200D) including another cross-coupled pair of inverters (consisting of the inverter 202 and the inverter 204) that provide a storage portion of the second SRAM cell. In some examples, the second SRAM cell may be substantially the same as the first SRAM cell, and may be formed as part of an SRAM array. Thus, the second SRAM cell may be in an adjacent column or row to the first SRAM cell. For the present example, the second SRAM cell is assumed to be in an adjacent column; however, other embodiments are possible, as described above. Continuing with this example, the second SRAM cell will include third N-type and P-type pass-gate transistors (substantially the same as pass-gate transistors N3, P3) coupled between a first side of the another storage portion of the second SRAM cell and an adjacent write bit line (WBL), the adjacent write bit line (WBL) being in an adjacent column to the write bit line (WBL) coupled to the first SRAM cell. The second SRAM cell may also include fourth N-type and P-type pass-gate transistors (substantially the same as pass-gate transistors N4, P4) coupled between a second side of the another storage portion of the second SRAM cell and an adjacent complementary write bit line (WBLB), the adjacent complementary write bit line (WBL) being in an adjacent column to the complementary write bit line (WBLB) coupled to the first SRAM cell. In one example, and when the second SRAM cell is in an adjacent column to the first SRAM cell, gates of the third N-type pass-gate transistor N3 and the fourth N-type pass-gate transistor N4 are also coupled to the first write word line (WWL). In an embodiment, and again when the second SRAM cell is in an adjacent column to the first SRAM cell, the second SRAM cell further includes another P-type transistor P5 coupled between gates of the third and fourth P-type pass-gate transistors P3, P4 and the second write word line (WWLB). The gate of the another P-type transistor P5 is coupled to an adjacent enable signal (EN_P), the adjacent enable signal (EN_P) including an enable line that is in an adjacent column to the enable signal (EN_P) or enable line that is coupled to the first SRAM cell. In some examples, the second SRAM cell further includes another single-ended read port 206 coupled between another read bit line (RBL) and a second side of the storage portion of the second SRAM cell.

In still another embodiment of block 1302, the SRAM-based circuit may include peripheral circuitry (e.g., such as peripheral circuitry 602). Thus, in an example, the peripheral circuitry may include a write inverter (e.g., such as the write inverter 604) configured to receive an input signal (WWLB_in) and to provide the second write word line (WWLB) as an output signal. In some embodiments, the peripheral circuitry also includes a first read inverter (e.g., such as the first read inverter 606) having a first input terminal and a first output terminal, the first input terminal coupled to the read bit line (RBL), the RBL coupled to the first SRAM cell, in the present example. The peripheral circuitry may further include a second read inverter (e.g., such as the second read inverter 608) having a second input terminal and a second output terminal, the second input terminal coupled to the first output terminal, and the second output terminal configured to provide a logic gate output based on the first write word line (WWL) and the input signal (WWLB_in), as previously described.

The method 1300 proceeds to block 1304 where a write operation is performed. In one example, and in an embodiment of block 1304, the write operation may initially include activating the P-type transistor P5 (e.g., of the first SRAM cell) by setting the enable signal (EN_P) to zero (logic "0"). After activating the P-type transistor P5, and in some cases, the write operation may further include activating the first N-type and P-type pass-gate transistors (pass-gate transistors N3, P3) by setting the first write word line (WWL) to $V_{DD}$ (logic "1") and the second write word line (WWLB) to zero (logic "0"). In an example, activating the first N-type and P-type pass-gate transistors causes data from the WBL to be written to a first storage node Q of the storage portion of the first SRAM cell. In a further embodiment of block 1304, and after activating the P-type transistor P5, the write operation may further include activating the second N-type and P-type pass-gate transistors (pass-gate transistors N4, P4) by setting the first write word line (WWL) to $V_{DD}$ (logic "1") and the second write word line (WWLB) to zero (logic "0"). In an example, activating the second N-type and P-type pass-gate transistors causes data from the WBLB to be written to a second storage node QB of the storage portion of the first SRAM cell. In still another embodiment of block 1304, after activating the first and second N-type and P-type pass-gate transistors to cause data from the WBL and the WBLB to be written to the first and second storage nodes, respectively, the write operation may further include inactivating the first and second N-type and P-type pass-gate transistors by setting the first write word line (WWL) to zero (logic "0") and the second write word line (WWLB) to $V_{DD}$ (logic "1"). After inactivating the first and second N-type and P-type pass-gate transistors, the write operation further includes inactivating the P-type transistor P5 by setting the enable signal to $V_{DD}$ (logic "1").

Considering a case where the second SRAM cell is provided in an adjacent column to the first SRAM cell, and in another embodiment of the write operation of block 1304, the first write word-line (WWL) being set to $V_{DD}$ will also activate the transistors N3, N4 of the second SRAM cell (e.g., the SRAM cell 200C). The second SRAM cell may thus be referred to as a row-half selected cell. However, in accordance with embodiments of block 1304, while activating the P-type transistor P5 (e.g., of the first SRAM cell) by setting the enable signal to zero (logic "0"), the method further comprises inactivating the another P-type transistor P5 (e.g., of the second SRAM cell) by setting the adjacent enable signal to $V_{DD}$ (logic "1"). As a result, during the write operation, a write disturbance will not occur (e.g., within the second SRAM cell 200C).

The method 1300 proceeds to block 1306 where a read operation is performed. In one example, and in an embodiment of block 1306 and after inactivating the P-type transistor P5, the read operation may include setting a read word line (RWL) of the single-ended read port (e.g., of the first SRAM cell) to $V_{DD}$ (logic "1"). In various embodiments, and as described above, the setting the RWL to $V_{DD}$ (logic "1") causes the RBL to either discharge through the single-ended read port based on a first value of the data written to the first storage node Q (and thus based on complementary data written the second storage node QB) or remain floating at $V_{DD}$ (logic "1") based on a second value of the data written to the first storage node Q (and thus based on complementary data written the second storage node QB).

The method 1300 proceeds to block 1308 where a logic operation is performed. In an example, and in an embodiment of block 1308, performing the logic operation may include modulating a pulse width, a pulse amplitude, or a bias condition, as described above. In some embodiments, performing the logic operation may include modulating a pulse width or a pulse amplitude of the first write word line (WWL) and the input signal (WWLB_in) to perform a NOR gate operation or a NAND gate operation using the SRAM-based circuit. It will be understood that a variety of other settings of the SRAM-based circuit can be used to implement a plurality of other logic functions, as described above, and are also within the scope of the logic operations that may be performed at block 1308.

As noted above, and in accordance with various embodiments, by employing a CFET device structure (e.g., such as stacked device structure 10), the disclosed SRAM device will occupy a very small area (small area overhead) as compared with at least some existing implementations. Elaborating on the comparison of bitcell area overhead for SRAM devices implemented using different SRAM cell topologies, reference is now made to FIG. 12, which provides a table 1200 showing a comparison of transistor effective widths (Weff) and bitcell areas for the different SRAM cell topologies. As shown for a 6T HC SRAM, the Weff ratio of pull-up transistors (PU), pass-gate transistors (PG), and pull-down transistors (PD) may be equal to 1:2:2. For comparison of bitcell area, a bitcell area ratio is defined, where the bitcell area of the 6T HC SRAM implemented using non-stacked CMOS is used as a baseline ratio of 1×. When implemented using a vertically stacked device structure (e.g., CFET), the bitcell area ratio of the 6T HC SRAM (compared to the baseline bitcell area of the 6T HC SRAM implemented using non-stacked CMOS) is equal to about ~0.68×. As shown for an 8T SRAM, the Weff ratio of pull-up transistors (PU), pass-gate transistors (PG), pull-down transistors (PD), and read-port transistors (RP) may be equal to 1:2:2:2. When implemented using non-stacked CMOS, the bitcell area ratio of the 8T SRAM (compared to the baseline bitcell area of the 6T HC SRAM implemented using non-stacked CMOS) is equal to about ~1.28×. When implemented using a vertically stacked device structure (e.g., CFET), the bitcell area ratio of the 8T SRAM (compared to the baseline bitcell area of the 6T HC SRAM implemented using non-stacked CMOS) is equal to about ~1.03×.

As shown for an 11T SRAM of the presently disclosed embodiments, the Weff ratio of pull-up transistors (PU), pass-gate transistors (PG), pull-down transistors (PD), and read-port transistors (RP) may be equal to 1:1:1:2. When implemented using non-stacked CMOS, the bitcell area ratio of the 11T SRAM (compared to the baseline bitcell area of the 6T HC SRAM implemented using non-stacked CMOS) is equal to about ~1.32×. When implemented using a vertically stacked device structure (e.g., CFET), the bitcell area ratio of the 11T SRAM (compared to the baseline bitcell area of the 6T HC SRAM implemented using non-stacked CMOS) is equal to about ~1.06×. Thus, the bitcell area of disclosed 11T SRAM is comparable to that of a standard 8T SRAM. In furtherance of the data shown in the table 1200, the Weff ratio of pull-up transistors (PU), N-type pass-gate transistors ($PG_N$), P-type pass gate transistors ($PG_P$), and pull-down transistors (PD) of the 11T SRAM may be equal to 1:1:1:1 to achieve an enhanced write ability without the use of write-assist techniques and additional NFET/PFET Weff sizing processes. Further, by using the vertically stacked device structure technology (e.g., CFET), the disclosed 11T SRAM cell minimizes the area penalty, and shows a very small area overhead compared with the 6T HC SRAM cell implemented using non-stacked CMOS technology.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods for providing a write-enhanced SRAM device and SRAM-based CIM devices. In some embodiments, a stacked transistor structure, such as a CFET structure, is used to implement an SRAM device. In some examples, one or more (previously) dummy PFETs of a vertically stacked device structure (CFET) may be used to enhance a write ability of an SRAM, and in particular, to provide a write-enhanced single-ended 11T SRAM. The write-enhanced single-ended 11T SRAM may be configured to operate in accordance with three reconfigurable schemes to perform various logic gate functionalities. Moreover, in some embodiments, the enhanced write ability may be provided without the introduction of write assist techniques and additional NFET/PFET Weff sizing processes. Further, in accordance with the disclosed embodiments, the write ability of the proposed SRAM can be enhanced by more than 2.5× compared with a 6T or 8T SRAM while mitigating the write half-selected disturb issue. The three reconfigurable schemes for the proposed SRAM may be configured to perform at least six types of logic gate functionalities, in some embodiments. Moreover, by employing CFET technology, the proposed 11T SRAM device occupies a very small area (small area overhead) as compared with a 6T HC SRAM cell using a non-stacked CMOS process and has a comparable footprint to a standard 8T SRAM cell. Additional embodiments and advantages will be evident to those skilled in the art in possession of this disclosure.

Thus, one of the embodiments of the present disclosure described an SRAM cell including a symmetric latch having a first inverter cross-coupled to a second inverter. The first inverter includes a first pull-up transistor and a first pull-down transistor, where drains of the first pull-up transistor and the first pull-down transistor are electrically coupled and define a first storage node Q. In some embodiments, the SRAM cell further includes a first N-type pass-gate transistor having a first drain coupled to a write bit line (WBL), a first source coupled to the first storage node Q, and a first gate coupled to a first write word line (WWL). In some examples, the SRAM cell further includes a first P-type pass-gate transistor having a second drain coupled to the write bit line (WBL) and a second source coupled to the first storage node Q. In some examples, the SRAM cell further includes a P-type transistor having a third drain, coupled to a second gate of the first P-type pass-gate transistor, a third source coupled to a second write word line (WWLB), and a third gate coupled to an enable signal.

In another of the embodiments, discussed is a method of operating a static random-access memory (SRAM)-based circuit. In some embodiments, the method includes providing a first SRAM cell. The first SRAM cell includes a cross-coupled pair of inverters that provide a storage portion of the first SRAM cell, and first N-type and P-type pass-gate transistors coupled between a first side of the storage portion of the first SRAM cell and a write bit line (WBL). In some embodiments, a gate of the first N-type pass-gate transistor is coupled to a first write word line (WWL). In some examples, the first SRAM cell further includes a P-type transistor coupled between a gate of the first P-type pass-gate transistor and a second write word line (WWLB), where a gate of the P-type transistor is coupled to an enable signal. In some embodiments, the method further includes activating the P-type transistor by setting the enable signal to zero (logic "0"). In some examples, the method further includes after activating the P-type transistor, activating the first N-type and P-type pass-gate transistors by setting the first write word line (WWL) to $V_{DD}$ (logic "1") and the second write word line (WWLB) to zero (logic "0"). In various examples, the activating the first N-type and P-type pass-gate transistors causes data from the WBL to be written to a first storage node of the storage portion of the first SRAM cell.

In yet another of the embodiments, discussed is compute-in-memory (CIM) device including an SRAM cell and peripheral circuitry. In some embodiments, the SRAM cell includes first N-type and P-type pass-gate transistors coupled between a first side of a storage portion of the SRAM cell and a write bit line (WBL). A first gate of the first N-type pass-gate transistor is coupled to a first write word line (WWL). In some examples, the SRAM cell further includes second N-type and P-type pass-gate transistors coupled between a second side of the storage portion of the SRAM cell opposite the first side and a complementary write bit line (WBLB). A second gate of the second N-type pass-gate transistor is coupled to the first write word line (WWL). In some embodiments, the SRAM cell further includes a P-type transistor coupled between gates of the first and second P-type pass-gate transistors and a second write word line (WWLB). In some embodiments, the SRAM cell further includes a read port coupled between a read bit line (RBL) and the second side of the storage portion of the SRAM cell. In some examples, the peripheral circuitry includes a write inverter configured to receive an input signal (WWLB_in) and to provide the second write word line (WWLB) as an output signal. In some embodiments, the peripheral circuitry further includes a first read inverter having a first input terminal and a first output terminal, the first input terminal coupled to the read bit line (RBL). In some examples, the peripheral circuitry further includes a second read inverter having a second input terminal and a second output terminal, the second input terminal coupled to the first output terminal, and the second output terminal configured to provide a logic gate output based on the first write word line (WWL) and the input signal (WWLB_in).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random-access memory (SRAM) cell, comprising:
    a symmetric latch including a first inverter cross-coupled to a second inverter, wherein the first inverter includes a first pull-up transistor and a first pull-down transistor, wherein drains of the first pull-up transistor and the first pull-down transistor are electrically coupled and define a first storage node Q;
    a first N-type pass-gate transistor having a first drain coupled to a write bit line (WBL), a first source coupled to the first storage node Q, and a first gate coupled to a first write word line (WWL);
    a first P-type pass-gate transistor having a second drain coupled to the write bit line (WBL) and a second source coupled to the first storage node Q; and
    a P-type transistor having a third drain, coupled to a second gate of the first P-type pass-gate transistor, a third source coupled to a second write word line (WWLB), and a third gate coupled to an enable signal.

2. The SRAM cell of claim 1, wherein the second inverter includes a second pull-up transistor and a second pull-down transistor, wherein drains of the second pull-up transistor and the second pull-down transistor are electrically coupled and define a second storage node QB, and wherein the SRAM cell further comprises:
    a second N-type pass-gate transistor having a fourth drain coupled to a complementary write bit line (WBLB), a fourth source coupled to the second storage node QB, and a fourth gate coupled to the first WWL; and
    a second P-type pass-gate transistor having a fifth drain coupled to the WBLB and a fifth source coupled to the second storage node QB;
    wherein the third drain of the P-type transistor is further coupled to a fifth gate of the second P-type pass-gate transistor.

3. The SRAM cell of claim 2, further comprising a read port coupled between a read bit line (RBL) and the second storage node QB.

4. The SRAM cell of claim 3, wherein the read port is a single-ended read port including a first N-type transistor and a second N-type transistor, the first N-type transistor having a sixth gate coupled to the second storage node and a sixth drain coupled to a sixth source of the second N-type transistor, the second N-type transistor further including a seventh drain coupled to the RBL and a seventh gate coupled to a read word line (RWL).

5. The SRAM cell of claim 3, wherein during a read operation, the read port isolates the second storage node QB from the read bit line (RBL).

6. The SRAM cell of claim 1, wherein the first write word line (WWL) is complementary to the second write word line (WWLB).

7. The SRAM cell of claim 1, wherein during a write operation, pulse widths of the first write word line (WWL) and the second write word line (WWLB) are less than a pulse width of the enable signal.

8. The SRAM cell of claim 7, wherein during the write operation, the first write word line (WWL) and the second write word line (WWLB) are set to $V_{DD}$ and zero, respectively, within a time period that the enable signal is set to zero.

9. The SRAM cell of claim 2, wherein a combination of the first N-type pass gate transistor and the first P-type pass gate transistor effectively operate as a first transmission gate coupled to the first storage node Q, and wherein a combination of the second N-type pass gate transistor and the second P-type pass gate transistor effectively operate as a second transmission gate coupled to the second storage node QB.

10. The SRAM cell of claim 2, wherein the first N-type pass gate transistor and the first P-type pass gate transistor share a same complementary field-effect transistor (CFET) device, and wherein the second N-type pass gate transistor and the second P-type pass gate transistor share the same CFET device.

11. A method of operating a static random-access memory (SRAM)-based circuit, comprising:
    providing a first SRAM cell comprising:
        a cross-coupled pair of inverters that provide a storage portion of the first SRAM cell;
        first N-type and P-type pass-gate transistors coupled between a first side of the storage portion of the first SRAM cell and a write bit line (WBL), wherein a gate of the first N-type pass-gate transistor is coupled to a first write word line (WWL); and
        a P-type transistor coupled between a gate of the first P-type pass-gate transistor and a second write word line (WWLB), wherein a gate of the P-type transistor is coupled to an enable signal;
    activating the P-type transistor by setting the enable signal to zero (logic "0"); and
    after activating the P-type transistor, activating the first N-type and P-type pass-gate transistors by setting the first write word line (WWL) to $V_{DD}$ (logic "1") and the second write word line (WWLB) to zero (logic "0"), wherein the activating the first N-type and P-type pass-gate transistors causes data from the WBL to be written to a first storage node of the storage portion of the first SRAM cell.

12. The method of operating the SRAM-based circuit of claim 11,
    wherein the providing the first SRAM cell further comprises providing second N-type and P-type pass-gate transistors coupled between a second side of the storage portion of the first SRAM cell and a complementary write bit line (WBLB), wherein a gate of the second N-type pass-gate transistor is coupled to the first write word line (WWL), and wherein the P-type transistor is further coupled between the gate of the second P-type pass-gate transistor and the second write word line (WWLB); and
    wherein after activating the P-type transistor, the method further comprises activating the second N-type and P-type pass-gate transistors by setting the first write word line (WWL) to $V_{DD}$ (logic "1") and the second write word line (WWLB) to zero (logic "0"), wherein the activating the second N-type and P-type pass-gate transistors causes data from the WBLB to be written to a second storage node of the storage portion of the first SRAM cell.

13. The method of operating the SRAM-based circuit of claim 11, further comprising:
   after activating the first N-type and P-type pass-gate transistors to cause data from the WBL to be written to the first storage node, inactivating the first N-type and P-type pass-gate transistors by setting the first write word line (WWL) to zero (logic "0") and the second write word line (WWLB) to $V_{DD}$ (logic "1"); and
   after inactivating the first N-type and P-type pass-gate transistors, inactivating the P-type transistor by setting the enable signal to $V_{DD}$ (logic "1").

14. The method of operating the SRAM-based circuit of claim 13,
   wherein the providing the first SRAM cell further comprises providing a single-ended read port coupled between a read bit line (RBL) and a second side of the storage portion of the first SRAM cell; and
   wherein after inactivating the P-type transistor, setting a read word line (RWL) of the single-ended read port to $V_{DD}$ (logic "1"), wherein the setting the RWL to $V_{DD}$ (logic "1") causes the RBL to either discharge through the single-ended read port based on a first value of the data written to the first storage node or remain floating at $V_{DD}$ (logic "1") based on a second value of the data written to the first storage node.

15. The method of operating the SRAM-based circuit of claim 11, further comprising:
   providing a second SRAM cell in an adjacent column to the first SRAM cell, the second SRAM cell comprising:
      another cross-coupled pair of inverters that provide another storage portion of the second SRAM cell;
      third N-type and P-type pass-gate transistors coupled between a first side of the another storage portion of the second SRAM cell and an adjacent write bit line (WBL); and
      another P-type transistor coupled between a gate of the third P-type pass-gate transistor and the second write word line (WWLB), wherein a gate of the another P-type transistor is coupled to an adjacent enable signal;
   wherein while activating the P-type transistor by setting the enable signal to zero (logic "0"), the method further comprises inactivating the another P-type transistor by setting the adjacent enable signal to $V_{DD}$ (logic "1").

16. The method of operating the SRAM-based circuit of claim 14, further comprising:
   providing peripheral circuitry comprising:
      a write inverter configured to receive an input signal (WWLB_in) and to provide the second write word line (WWLB) as an output signal;
      a first read inverter including a first input terminal and a first output terminal, the first input terminal coupled to the read bit line (RBL); and
      a second read inverter including a second input terminal and a second output terminal, the second input terminal coupled to the first output terminal, and the second output terminal configured to provide a logic gate output based on the first write word line (WWL) and the input signal (WWLB_in); and
   modulating a pulse width or a pulse amplitude of the first write word line (WWL) and the input signal (WWLB_in) to perform a NOR gate operation or a NAND gate operation using the SRAM-based circuit.

17. A compute-in-memory (CIM) device, comprising:
   an SRAM cell and peripheral circuitry, wherein the SRAM cell comprises:
      first N-type and P-type pass-gate transistors coupled between a first side of a storage portion of the SRAM cell and a write bit line (WBL), wherein a first gate of the first N-type pass-gate transistor is coupled to a first write word line (WWL);
      second N-type and P-type pass-gate transistors coupled between a second side of the storage portion of the SRAM cell opposite the first side and a complementary write bit line (WBLB), wherein a second gate of the second N-type pass-gate transistor is coupled to the first write word line (WWL);
      a P-type transistor coupled between gates of the first and second P-type pass-gate transistors and a second write word line (WWLB); and
      a read port coupled between a read bit line (RBL) and the second side of the storage portion of the SRAM cell; and
   wherein the peripheral circuitry comprises:
      a write inverter configured to receive an input signal (WWLB_in) and to provide the second write word line (WWLB) as an output signal;
      a first read inverter including a first input terminal and a first output terminal, the first input terminal coupled to the read bit line (RBL); and
      a second read inverter including a second input terminal and a second output terminal, the second input terminal coupled to the first output terminal, and the second output terminal configured to provide a logic gate output based on the first write word line (WWL) and the input signal (WWLB_in).

18. The CIM device of claim 17, wherein a pulse width of the first write word line (WWL) and the input signal (WWLB_in) is modulated to perform a NOR gate operation or a NAND gate operation.

19. The CIM device of claim 17, wherein a pulse amplitude of the first write word line (WWL) and the input signal (WWLB_in) is modulated to perform a NOR gate operation or a NAND gate operation.

20. The CIM device of claim 17, wherein bias conditions of the write bit line (WBL) and the complementary write bit line (WBLB) are modulated to perform a NOR gate operation or a NAND gate operation.

* * * * *